(12) United States Patent
Murayama et al.

(10) Patent No.: US 11,298,959 B2
(45) Date of Patent: Apr. 12, 2022

(54) ACTIVE ENERGY RADIATION UNIT AND ACTIVE ENERGY RADIATION DEVICE

(71) Applicant: HAMAMATSU PHOTONICS K.K., Hamamatsu (JP)

(72) Inventors: Kyoichi Murayama, Hamamatsu (JP); Keita Umeno, Hamamatsu (JP); Ryotaro Matui, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/000,812

(22) Filed: Aug. 24, 2020

(65) Prior Publication Data
US 2021/0060978 A1 Mar. 4, 2021

(30) Foreign Application Priority Data

Aug. 26, 2019 (JP) .............................. JP2019-153801
Jun. 17, 2020 (JP) .............................. JP2020-104783

(51) Int. Cl.
*B41J 11/00* (2006.01)
*B41M 7/00* (2006.01)

(52) U.S. Cl.
CPC .......... *B41J 11/002* (2013.01); *B41M 7/0081* (2013.01)

(58) Field of Classification Search
CPC ................ B41J 11/002; B41J 11/00218; B41J 11/00214; B41M 7/0081; B05D 3/0466; B05D 3/065; H01L 21/67115
See application file for complete search history.

(56) References Cited

U.S. PATENT DOCUMENTS

2009/0207223 A1   8/2009   Cofler et al.

FOREIGN PATENT DOCUMENTS

| JP | 2012-166539 A | 9/2012 | |
| WO | WO 2018/074283 A1 | 4/2018 | |
| WO | WO-2018074283 A1 * | 4/2018 | ........... B23K 26/127 |
| WO | WO 2019/151148 A1 | 8/2019 | |
| WO | WO-2019151148 A1 * | 8/2019 | ........... B41F 23/0409 |
| WO | WO 2020/022424 A1 | 1/2020 | |
| WO | WO-2020022424 A1 * | 1/2020 | ................ B41J 2/01 |

OTHER PUBLICATIONS

U.S. Appl. No. 10/562,320, filed Feb. 18, 2020, Kyocera Corp.

\* cited by examiner

*Primary Examiner* — Bradley W Thies
(74) *Attorney, Agent, or Firm* — Faegre Drinker Biddle & Reath LLP

(57) ABSTRACT

An active energy radiation unit includes a light source which radiates ultraviolet rays onto a target object, and a main gas supply mechanism which is disposed to be adjacent to the light source and ejects an inert gas. The main gas supply mechanism includes a receiving part which receives the inert gas, and a main ejection port which is provided at a position between the receiving part and the light source and closer to the target object than the receiving part. A flow path area from the receiving part to the main ejection port is constant.

14 Claims, 18 Drawing Sheets

ACTIVE ENERGY RADIATION UNIT AND ACTIVE ENERGY RADIATION DEVICE

TECHNICAL FIELD

The present invention relates to an active energy radiation unit and an active energy radiation device.

BACKGROUND

Patent Document 1 discloses an active energy ray radiation device as a device for forming a film on a surface of a medium. The active energy ray radiation device radiates active energy rays onto a material applied to the medium. The material applied to the medium is cured by radiating the active energy rays. As a result, the film is formed on the surface of the medium.

RELATED ART DOCUMENTS

Patent Document

[Patent Document 1] Japanese Unexamined Patent Publication No. 2012-166539

SUMMARY

As also described in Patent Document 1, it is known that a curing operation of a film material that is cured by receiving active energy rays is hindered by oxygen present around the film material. Therefore, if an oxygen concentration is not uniform in the vicinity of a region irradiated with the active energy rays, an optical processing result in accordance with the oxygen concentration is obtained. A desired processing result can be obtained in a region in which the oxygen concentration is low. However, a desired processing result may not be obtained in a region in which the oxygen concentration is high.

The present invention provides an active energy radiation unit and an active energy radiation device by which a region in which a desired processing result is obtained can be enlarged.

An active energy radiation unit according to one aspect of the present invention includes an active energy radiation part which radiates active energy rays onto a target object disposed in an active energy radiation region extending in a first direction, and a main gas supply mechanism which is disposed to be adjacent to the active energy radiation part in a second direction intersecting the first direction and ejects an inert gas for forming an inactive region including the active energy radiation region between the target object and the active energy radiation part. The main gas supply mechanism includes a receiving part which receives a compressed inert gas, and an ejection port which is provided between the active energy radiation part and the receiving part in the second direction and at a position closer to the target object than the receiving part. A flow path area from the receiving part and the ejection part is constant.

The active energy radiation unit has the main gas supply mechanism disposed adjacent to the active energy radiation part. The inert gas is ejected from the main gas supply mechanism. The ejected inert gas forms the inactive region having a low oxygen concentration around the active energy radiation region. Further, the main gas supply mechanism receives the inert gas from the receiving part and ejects the inert gas from an ejection port. Here, the flow path area from the receiving part to the ejection port is constant. If the flow path area is constant, a flow state of the inert gas is maintained between the receiving part and the ejection port. Then, from the flow of the inert gas ejected from the ejection port, a first flow toward the active energy radiation region and a second flow directed vertically downward toward the target object are generated. As described above, the first flow of the inert gas forms the inactive region having a low oxygen concentration around the active energy radiation region. The first flow of the inert gas induces an airflow toward the active energy radiation region. That is, the air containing oxygen is supplied toward the active energy radiation region. At this point, the second flow of the inert gas flows vertically downward toward the target object. The vertically downward flow of the inert gas can block an airflow toward the active energy radiation region. Therefore, the active energy radiation unit can form the inactive region around the active energy radiation region by supplying the inert gas to the active energy radiation region. Further, the active energy radiation unit can block air supply to the active energy radiation region using the flow of the inert gas directed vertically downward. As a result, the region in which the oxygen concentration is kept low is enlarged in the vicinity of the active energy radiation region. Therefore, a region in which a desired processing result is obtained can be enlarged.

In one aspect, the active energy radiation unit may further include a sub gas supply mechanism which extends in the second direction, is disposed to sandwich the active energy radiation region in the first direction, and ejects the inert gas. An airflow toward the active energy radiation region is also provided from a side part side of the active energy radiation region. The airflow from the side part side of the active energy radiation region toward the active energy radiation region can be blocked by the sub gas supply mechanism. As a result, the region in which the desired processing result is obtained can be further enlarged.

In one aspect, one end of the sub gas supply mechanism in the second direction may be connected to the main gas supply mechanism. The active energy radiation part may be disposed between the one end of the sub gas supply mechanism and the other end of the sub gas supply mechanism in the second direction. According to these configurations, a light source is disposed in a region surrounded by the main gas supply mechanism and the sub gas supply mechanism. Therefore, the inactive region including the active energy radiation region can be reliably formed.

In one aspect, the main gas supply mechanism may further have an introduction part to which a gas pipe for supplying the compressed inert gas is connected, a first flow path part which receives the inert gas from the introduction part, and a second flow path part which receives the inert gas from the first flow path part and provides the inert gas to the receiving part. A flow path area of the first flow path part may be larger than flow path areas of the introduction part and the second flow path part. The first flow path part may be formed by a rectifying slope surface which is disposed to intersect an axis of the introduction part and obstructs a flow of the inert gas received from the introduction part. According to these configurations, the flow of the inert gas received from the introduction part spreads in a predetermined direction due to an operation of the rectifying surface that obstructs the flow of the inert gas. As a result, a flow rate distribution of the inert gas ejected from the ejection port in the predetermined direction is formed to be uniform. Therefore, the flow rate of the inert gas required to form the inactive region can be reduced.

In one aspect, the rectifying surface may be a slope surface that is inclined with respect to the axis of the introduction part. According to this configuration, the flow of the inert gas can be changed smoothly.

An active energy radiation device according to another aspect of the present invention includes the active energy radiation unit described above, and a transfer part which causes a relative movement of the target object with respect to the active energy radiation region. The active energy radiation device includes the active energy radiation unit described above. Therefore, similar to the active energy radiation unit, the region in which the oxygen concentration is kept low is enlarged in the vicinity of the active energy radiation region. As a result, the region in which the desired processing result is obtained can be enlarged.

In another aspect, the transfer part may transfer the target object, and the second direction may be the transfer direction of the target object. According also to this configuration, it is possible to properly obtain the effect that the region in which the desired processing result is obtained can be enlarged.

According to the present invention, an active energy radiation unit and an active energy radiation device by which a region in which a desired processing result is obtained can be enlarged are provided.

DETAILED DESCRIPTION

Hereinafter, aspects for carrying out the present invention will be described in detail with reference to the accompanying drawings. In description of the drawings, the same elements will be denoted by the same reference signs and repeated descriptions thereof will be omitted.

Figure 1:
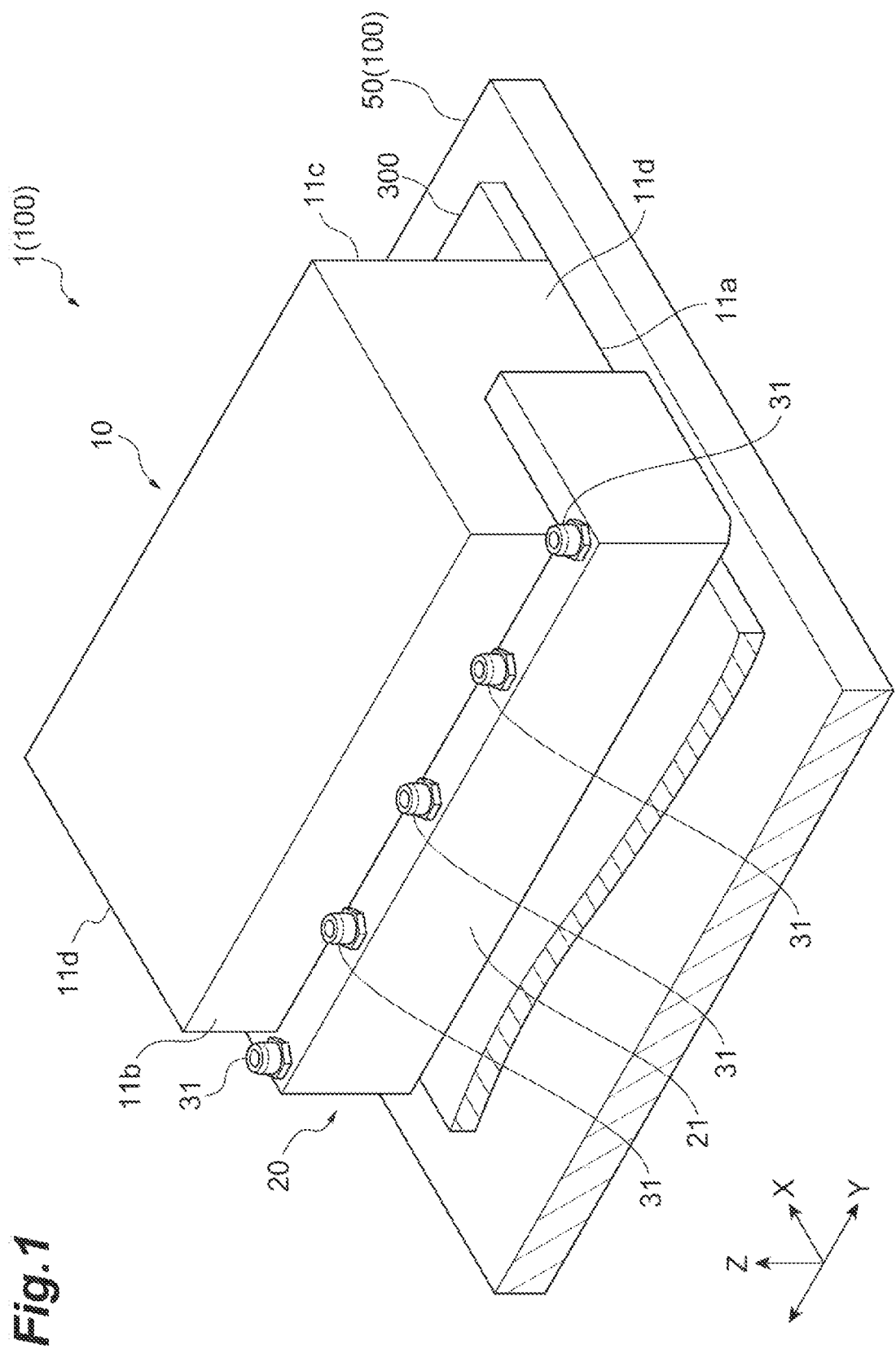
FIG. 1 is a perspective view showing an active energy radiation device of an embodiment.

FIG. 1 shows an active energy radiation device 100. The active energy radiation device 100 radiates active energy rays onto a moving target object 300. A resin material is applied to the target object 300. Examples of the active energy rays include ultraviolet rays and electron beams. Examples of uses of the active energy radiation device 100 include printing and packaging. For example, the active energy radiation device 100 that radiates ultraviolet rays is used for processing a photocurable resin. Examples of the photocurable resin include a UV curable resin that is cured by light energy of ultraviolet rays. In addition, among resins that are cured by receiving energy, there are also resins that are cured by receiving energy from an electron beam. Therefore, the active energy radiation device 100 that radiates an electron beam can also be used for processing an electron beam curable resin. In the following description, an active energy radiation device 100 used for processing a UV curable resin will be exemplified.

A drying rate of a UV curable resin is affected by oxygen. Specifically, oxygen hinders curing of a UV curable resin. Therefore, a concentration of oxygen in a region in which a UV curing resin is cured is lowered. The concentration of oxygen in a region in which the UV curable resin is irradiated with ultraviolet rays is lowered. For example, a region in which an inert gas is predominant is formed on a region including a radiation region of ultraviolet rays. Such a region in which an inert gas is predominant is called a purge region. Examples of the inert gas include nitrogen.

The active energy radiation device 100 forms a purge region and radiates ultraviolet rays onto a UV curable resin in the purge region. More specifically, the active energy radiation device 100 radiates ultraviolet rays onto the UV curable resin applied to a surface of the target object 300. The active energy radiation device 100 is fixed to a structure (not shown). That is, the active energy radiation device 100 does not move. On the other hand, the target object 300 is continuously moved by a transfer device 50 in a transfer direction X (a second direction). Examples of the target object 300 include papers, films, and sheets.

The active energy radiation device 100 includes the active energy radiation unit 1 and the transfer device 50 (a transfer part) as main components.

The transfer device 50 causes a relative movement of the target object 300 with respect to the active energy radiation region, which will be described later.

The active energy radiation unit 1 has a light radiation part 10 and a purge part 20 as main components.

Figure 2:
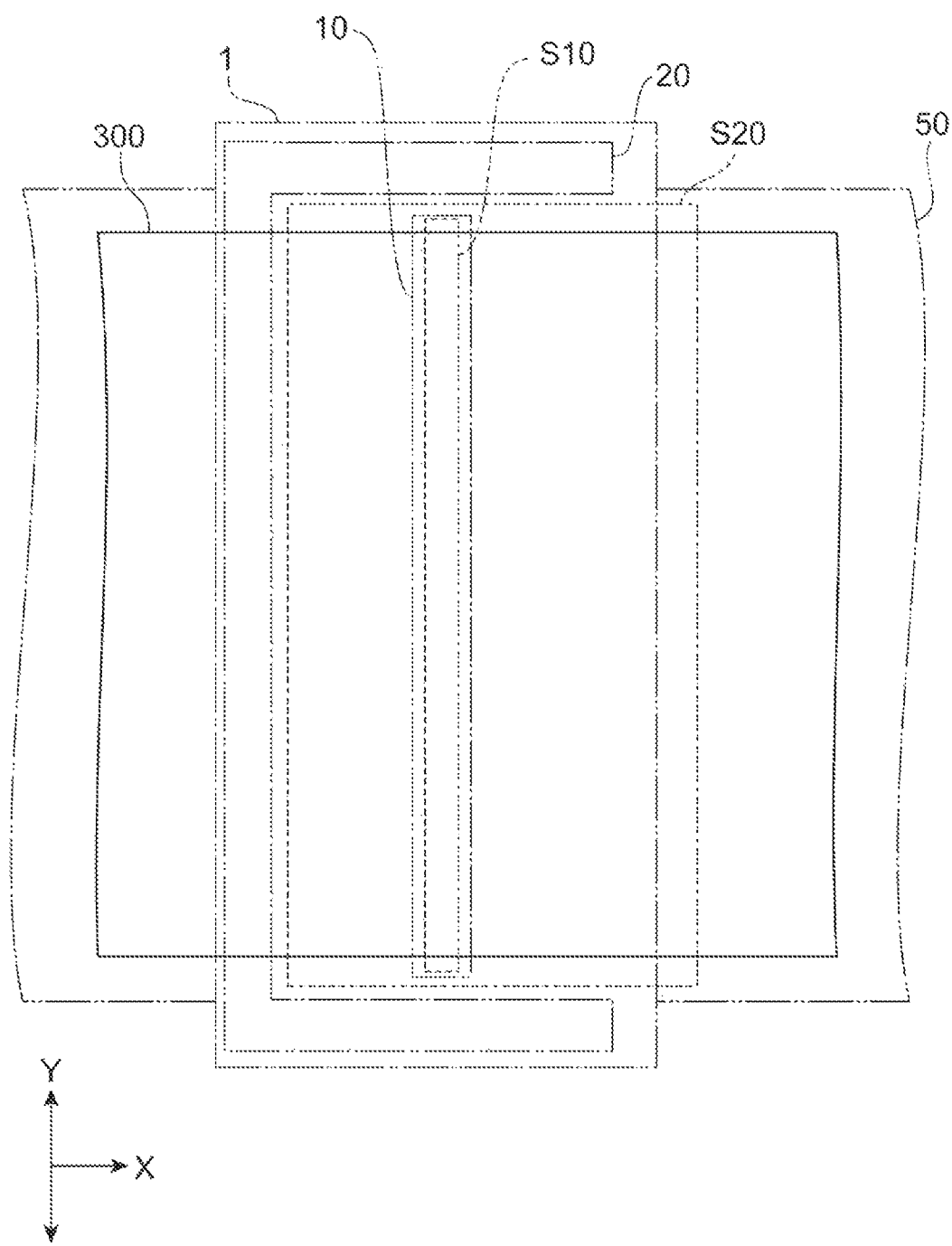
FIG. 2 is a diagram showing an active energy radiation region and a purge region.

As shown in FIG. 2, the light radiation part 10 radiates ultraviolet rays (active energy rays) onto the active energy radiation region S10. The target object 300 is transferred by the transfer device 50 through the active energy radiation region S10. Therefore, the target object 300 receives the ultraviolet rays while being transferred in the transfer direction X. The purge part 20 forms a purge region S20. An oxygen concentration of the purge region S20 is lower than an oxygen concentration of air. The purge part 20 forms the purge region S20 by ejecting an inert gas.

The purge region S20 includes at least the active energy radiation region S10. The purge region S20 may include a region on an upstream side of the active energy radiation region S10 and a region on a downstream side of the active energy radiation region S10. The region on the upstream side of the active energy radiation region S10 and the region on the downstream side of the active energy radiation region S10 are arranged in the transfer direction X. The purge region S20 may include a region sandwiching the active energy radiation region S10 in a direction (a width direction Y: a first direction) intersecting the transfer direction X.

Figure 3:
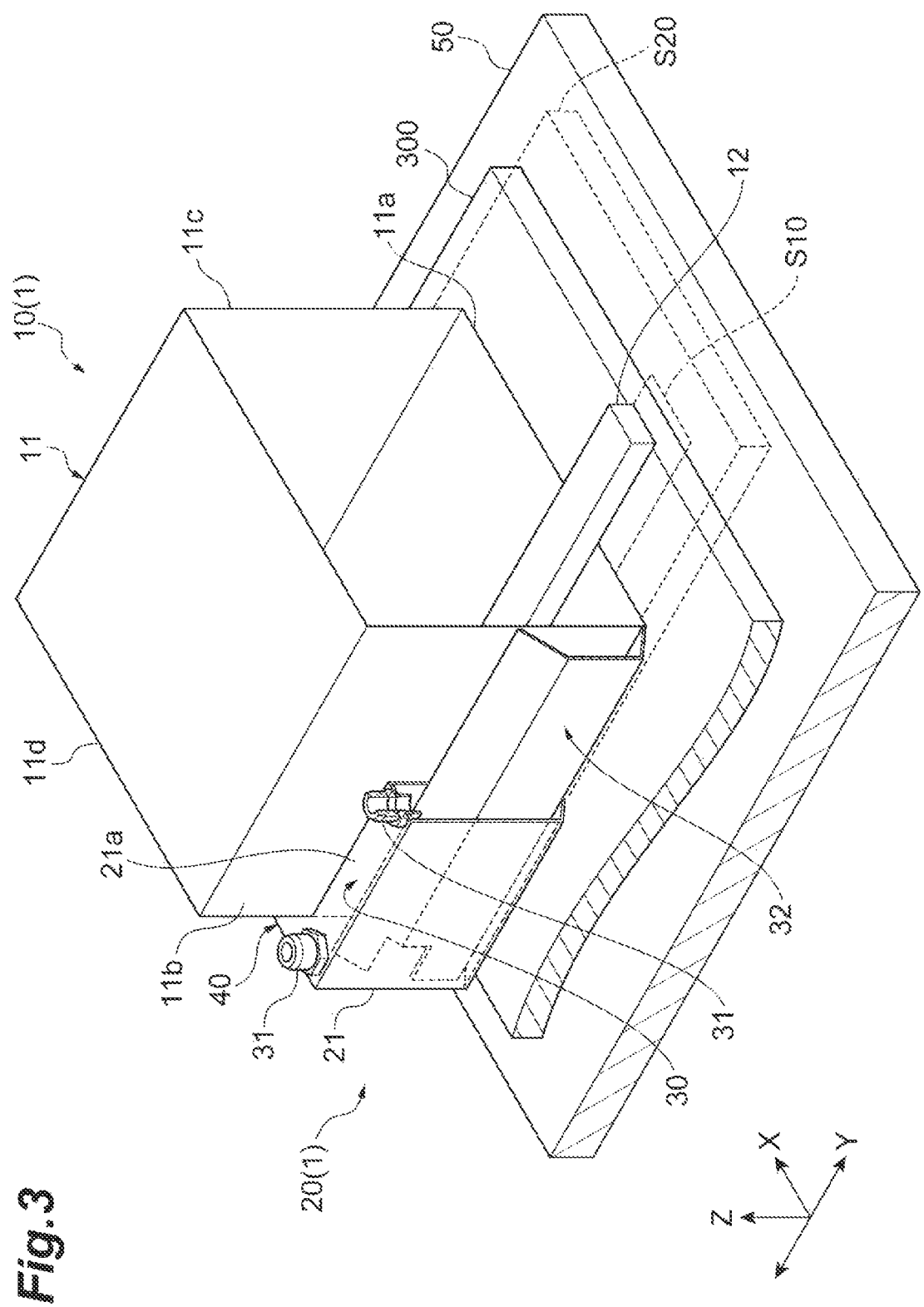
FIG. 3 is a perspective view showing an internal structure of an active energy radiation unit.

As shown in FIG. 3, the light radiation part 10 includes a radiation housing 11 and a light source 12 (active energy radiation part). The radiation housing 11 constitutes a base body of the light radiation part 10. A shape of the radiation housing 11 is, for example, a rectangular parallelepiped. The radiation housing 11 includes a radiation main surface 11a facing the target object 300, a radiation front surface 11b on an upstream side in the transfer direction X, a radiation back surface 11c on a downstream side in the transfer direction X, and a pair of radiation side surfaces 11d. The radiation housing 11 accommodates various components that constitute the light radiation part 10 including the light source 12. For example, the radiation housing 11 may accommodate a power supply board that supplies electric power to the light source 12 and a control board for the light source 12.

The light source 12 emits light which is radiated on the active energy radiation region S10. The active energy radiation region S10 is set below the radiation housing 11. The active energy radiation region S10 has a rectangular shape in a plan view. The active energy radiation region S10 extends in the width direction Y orthogonal to the transfer direction X. The light source 12 radiates light on the active energy radiation region S10. The light source 12 extends in the width direction Y orthogonal to the transfer direction X. As an example, a width of the light source 12 is longer than a width of the radiation housing 11. Also, the width of the light source 12 may be substantially the same as the width of the radiation housing 11. The light emitted by the light source 12 is ultraviolet light. The light source 12 is attached to the radiation main surface 11a of the radiation housing 11. The light source 12 is disposed on a downstream side in the transfer direction X a predetermined distance from the radiation front surface 11b. For example, a distance from the radiation front surface 11b to the light source 12 in the transfer direction X may be shorter than a distance from the light source 12 to the radiation back surface 11c.

The purge part 20 has a main gas supply mechanism 30 and a sub gas supply mechanism 40. The main gas supply mechanism 30 and the sub gas supply mechanism 40 are integrated by a purge housing 21.

<Main Gas Supply Mechanism>

Figure 4:
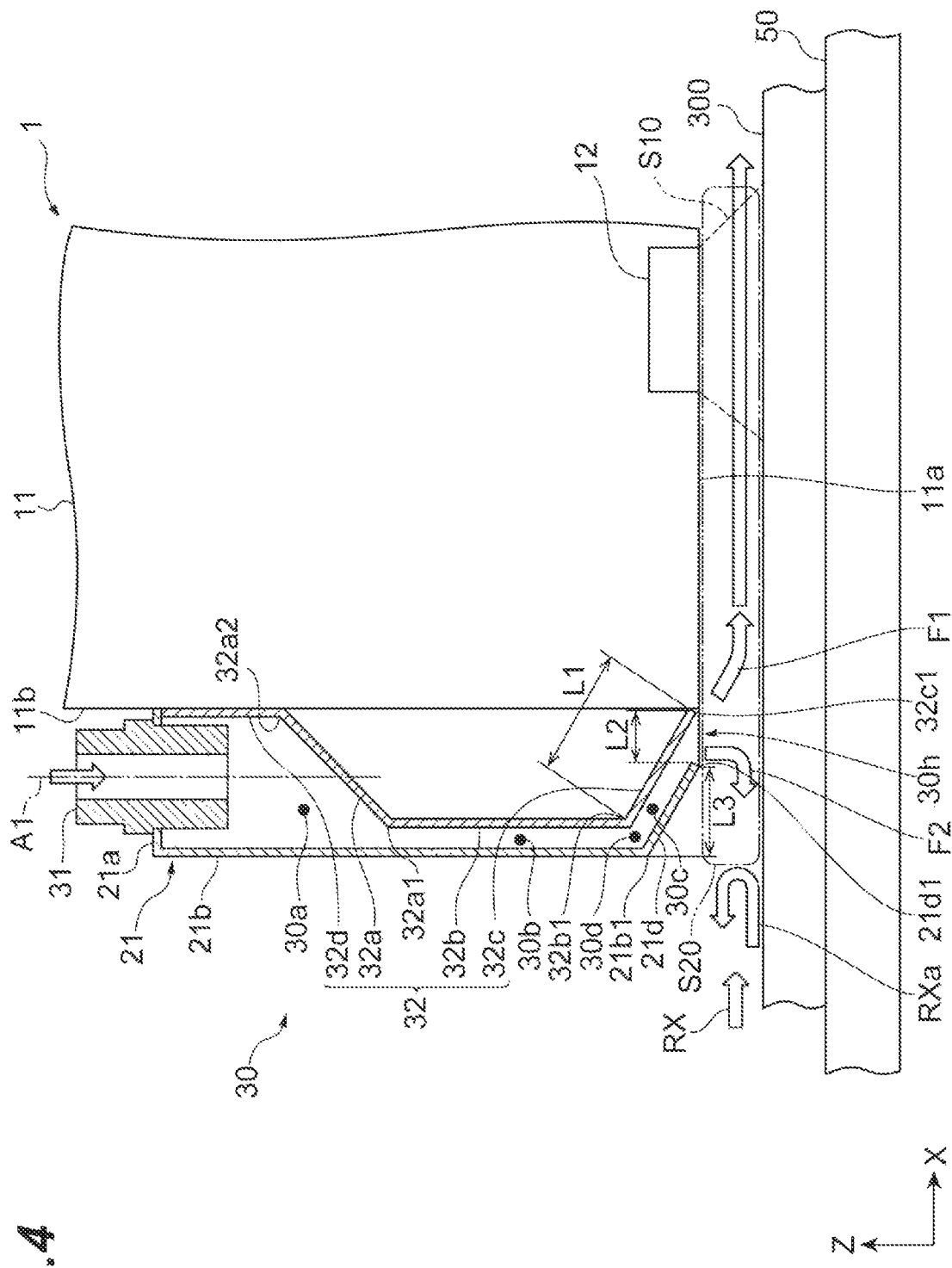
FIG. 4 is a cross-sectional view showing a main gas supply mechanism.

As shown in FIG. 4, the main gas supply mechanism 30 has a main ejection port 30h (an ejection part). The main gas supply mechanism 30 ejects nitrogen gas for forming the purge region S20 from the main ejection port 30h. The main gas supply mechanism 30 ejects nitrogen gas for blocking an airflow (see arrow RX) that tries to enter a gap between the target object 300 and the active energy radiation unit 1. More specifically, as the target object 300 moves in the transfer direction X, air tries to enter from an upstream side of the active energy radiation unit 1. In other words, as the target object 300 moves, air tries to enter from between the radiation housing 11 and the target object 300. The main gas supply mechanism 30 ejects the nitrogen gas for inhibiting the airflow from the upstream side.

The main gas supply mechanism 30 is attached to the radiation front surface 11b of the radiation housing 11. That is, the main gas supply mechanism 30 is disposed on an upstream side of the light source 12 in the transfer direction X. Also, the main gas supply mechanism 30 extends in the width direction Y. For example, a width of the main gas supply mechanism 30 may be the same as the width of the radiation housing 11 or larger than the width of the radiation housing 11. That is, the main gas supply mechanism 30 extends from one radiation side surface 11d to the other radiation side surface 11d.

A more detailed configuration of the main gas supply mechanism 30 will be described. The main gas supply mechanism 30 has a plurality of sockets 31 (introduction parts) and a rectifying plate 32.

Plugs (not shown) are inserted into each of the plurality of sockets 31. A plug is a tip of a pipe that provides compressed nitrogen gas. The socket 31 receives the compressed nitrogen gas. The plurality of sockets 31 are provided on a purge upper surface 21a of the purge housing 21. The plurality of sockets 31 are separated from each other at predetermined intervals in the width direction Y (see FIG. 1). The intervals between the plurality of sockets 31 may be, for example, equal intervals. An axis A1 of the socket 31 is orthogonal to the purge upper surface 21a. According to this configuration, the nitrogen gas is received downward (in a negative height direction Z) from the purge upper surface 21a.

The purge housing 21 and the rectifying plate 32 form a flow path through which the nitrogen gas received from the socket 31 passes. The purge housing 21 and the rectifying plate 32 form the main ejection port 30h for ejecting the nitrogen gas.

The main gas supply mechanism 30 includes a first flow path part 30a, a second flow path part 30b, and a third flow path part 30c. The nitrogen gas received from the socket 31 passes through the first flow path part 30a, the second flow path part 30b, and the third flow path part 30c in order and is ejected from the main ejection port 30h.

The first flow path part 30a receives the nitrogen gas from the socket 31. Then, the first flow path part 30a provides the nitrogen gas to the second flow path part 30b. The first flow path part 30a is a region surrounded by the purge upper surface 21a, a purge front surface 21b, a rectifying back surface 32d, and an upper rectifying slope surface 32a (a rectifying surface). The first flow path part 30a includes a portion of which a flow path area decreases in a direction in which the nitrogen gas flows. Specifically, the first flow path part 30a includes a first portion between the purge front surface 21b and the rectifying back surface 32d, and a second portion between the purge front surface 21b and the upper rectifying slope surface 32a. A distance from the purge front surface 21b to the rectifying back surface 32d is constant. Therefore, the flow path area of the first portion is constant. On the other hand, the upper rectifying slope surface 32a is inclined with respect to the height direction Z. In other words, a lower side 32a1 of the upper rectifying slope surface 32a is located on an upstream side of an upper side 32a2 of the upper rectifying slope surface 32a in the transfer direction X. According to this configuration, the flow path area of the second portion gradually decreases toward the second flow path part 30b.

The socket 31 is provided on the purge upper surface 21a such that the axis A1 thereof is disposed substantially in a center between the purge front surface 21b and the rectifying back surface 32d. The axis A1 of the socket 31 intersects the upper rectifying slope surface 32a. In other words, the axis A1 of the socket 31 is disposed between the lower side 32a1 and the upper side 32a2 of the upper rectifying slope surface 32a in the transfer direction X. According to this configuration, the flow of the nitrogen gas received from the socket 31 collides with the upper rectifying slope surface 32a. Then, the nitrogen gas flows along the upper rectifying slope surface 32a toward the upstream side in the transfer direction X, and then reaches the second flow path part 30b.

The second flow path part 30b receives the nitrogen gas from the first flow path part 30a. Then, the second flow path part 30b provides the nitrogen gas to the third flow path part 30c. In other words, the second flow path part 30b guides the nitrogen gas to the target object 300 side in the height direction Z. The second flow path part 30b is a region surrounded by the purge front surface 21b and a rectifying upright surface 32b. A distance from the purge front surface 21b to the rectifying upright surface 32b is constant. For example, the distance from the purge front surface 21b to the rectifying upright surface 32b is about 4.5 mm. The flow path area of the second flow path part 30b is constant. The flow path area of the second flow path part 30b is smaller than a flow path area between the purge front surface 21b and the rectifying back surface 32d included in the first flow path part 30a. The flow path area of the second flow path part 30b is the same as a flow path area between the purge front surface 21b included in the first flow path part 30a and the lower side 32a1 of the upper rectifying slope surface 32a.

The third flow path part 30c receives the nitrogen gas from the second flow path part 30b. Then, the third flow path part 30c ejects the nitrogen gas from the main ejection port 30h. The third flow path part 30c includes a receiving part 30d that receives the compressed nitrogen gas. More specifically, the receiving part 30d is a region between a lower side 21b1 of the purge front surface 21b and a lower side 32b1 of the rectifying upright surface 32b. The third flow path part 30c is a region surrounded by a purge slope surface 21d and a lower rectifying slope surface 32c. The purge slope surface 21d extends from the lower side 21b1 of the purge front surface 21b toward the downstream side in the transfer direction X. That is, a lower side 21d1 of the purge slope surface 21d is disposed on the downstream side of the lower side 21b1 of the purge front surface 21b in the transfer direction X. Similarly, the lower rectifying slope surface 32c extends from the lower side 32b1 of the rectifying upright surface 32b toward the downstream side in the transfer direction X. In other words, a lower side 32c1 of the lower rectifying slope surface 32c is disposed on the downstream side of the lower side 32b1 of the rectifying upright surface 32b in the transfer direction X. In addition, a distance between the purge slope surface 21d and the lower rectifying slope surface 32c is constant in a direction in which the purge slope surface 21d and the lower rectifying slope surface 32c extend. Therefore, a flow path area of the third flow path part 30c is constant in the direction in which the purge slope surface 21d and the lower rectifying slope surface 32c extend.

When a flow path area is said to be constant, it does not have to be strictly constant in a dimensional number. In the present embodiment, when a flow path area is said to be constant, it functionally indicates that a state of the nitrogen gas flowing through the third flow path part 30c does not change significantly. According to Bernoulli's theorem, a flow velocity and a pressure change as a flow path area changes. That is, when a flow path area is said to be constant in the present embodiment, it indicates that there is no significant change between a flow velocity and a pressure at an inlet (the receiving part 30d) of the third flow path part 30c and a flow velocity and a pressure at an outlet (the main ejection port 30h) of the third flow path part 30c.

The nitrogen gas ejected from the main ejection port 30h of the third flow path part 30c is divided into a first flow F1 and a second flow F2. The first flow F1 flows in a direction of the third flow path part 30c. That is, the first flow F1 flows toward the downstream side in the transfer direction X, and then forms the purge region S20.

The second flow F2 flows toward the target object 300. The first flow F1 also finally flows along the target object 300. Therefore, it can be said that the first flow F1 also flows toward the target object 300. However, the fact that the second flow F2 flows toward the target object 300 indicates that the second flow F2 moves a short distance from the main ejection port 30h to the target object 300. For example, the second flow F2 is vertically downward from the main ejection port 30h (in the negative height direction Z). For example, the second flow F2 can also be said to form an air curtain. In other words, the second flow F2 from the main ejection port 30h to the target object 300 does not substantially have a component directed downstream in the transfer direction X. The second flow F2, after reaching the target object 300, mainly flows upstream (in a negative transfer direction X) along the surface of the target object 300. The second flow F2, after reaching the surface of the target object 300, may include a portion that flows downstream (in a positive transfer direction X) along the surface.

According to the first flow F1 and the second flow F2, the purge region S20 can be formed by the first flow F1. Further, according to the first flow F1 and the second flow F2, entrance of air can be inhibited by the second flow F2.

In order to generate the first flow F1 and the second flow F2, a direction in which the third flow path part 30c extends (the direction in which the nitrogen gas flows), a length L1 of the third flow path part 30c, an opening length L2 of the main ejection port 30h, and a projection length L3 of the third flow path part 30c may be set appropriately. The length L1 of the third flow path part 30c is, for example, a length from the lower side 32b1 of the rectifying upright surface 32b to the lower side 32c1 of the lower rectifying slope surface 32c. The opening length L2 of the main ejection port 30h is a length in the transfer direction X from the lower side 21d1 of the purge slope surface 21d to the lower side 32c1 of the lower rectifying slope surface 32c. The projection length L3 is a length in the transfer direction X from the lower side 21b1 of the purge front surface 21b to the lower side 21d1 of the purge slope surface 21d. An example of the projection length L3 is, for example, 15 mm. Further, an example of an angle of the purge slope surface 21d with respect to the transfer direction X is, for example, 30 degrees.

<Sub Gas Supply Mechanism>

Figure 5:
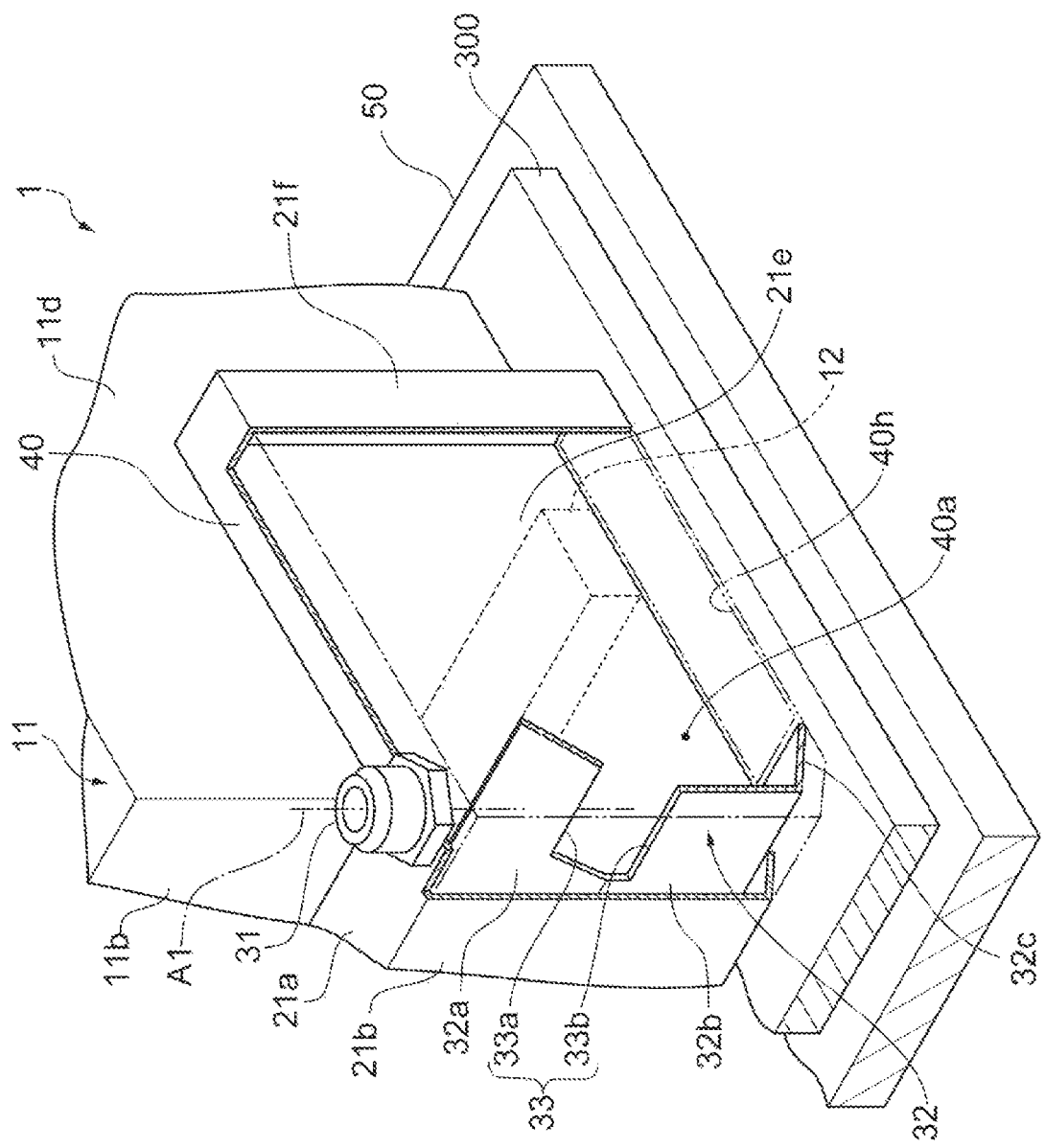
FIG. 5 is a perspective view showing a sub gas supply mechanism.

As shown in FIG. 5, the sub gas supply mechanism 40 has a sub ejection port 40h. The sub gas supply mechanism 40 ejects the nitrogen gas for blocking an airflow that tries to enter the gap between the target object 300 and the active energy radiation unit 1 from the sub ejection port 40h. The air that tries to enter the gap between the target object 300 and the active energy radiation unit 1 as the target object 300 moves is not only from the upstream side of the active energy radiation unit 1 (that is, the radiation front surface 11b side). The air also tries to enter the gap between the target object 300 and the active energy radiation unit 1 from the radiation side surface 11d sides of the active energy radiation unit 1. The sub gas supply mechanism 40 discharges the nitrogen gas for blocking the airflow from the radiation side surfaces 11d of the active energy radiation unit 1.

The sub gas supply mechanism 40 is attached to each of the pair of radiation side surfaces 11d of the radiation housing 11. More specifically, the sub gas supply mechanism 40 extends from the radiation front surface 11b toward the radiation back surface 11c. That is, the sub ejection port 40h of the sub gas supply mechanism 40 extends from the radiation front surface 11b toward the radiation back surface 11c. A front end of the sub gas supply mechanism 40 is disposed in the vicinity of the radiation front surface 11b of the radiation housing 11. In other words, the front end of the sub gas supply mechanism 40 is disposed on the upstream side of the light source 12. A rear end of the sub gas supply mechanism 40 is disposed between the radiation front surface 11b and the radiation back surface 11c of the radiation housing 11. For example, the rear end of the sub gas supply mechanism 40 may be disposed on the downstream side of the light source 12.

According to such a configuration, the light source 12 is disposed in a region surrounded by the main gas supply mechanism 30 and the sub gas supply mechanism 40. The light source 12 is disposed in a region surrounded by the purge part 20.

The sub gas supply mechanism 40 receives the nitrogen gas from an opening 33 provided in the rectifying plate 32. More specifically, the opening 33 includes a slope surface opening 33a provided on the upper rectifying slope surface 32a and an upright surface opening 33b provided on the rectifying upright surface 32b. The slope surface opening 33a is provided on a lower side of the upper rectifying slope surface 32a. The upright surface opening 33b is provided on an upper side of the rectifying upright surface 32b. Positions of the openings 33 in the width direction Y correspond to positions of the sockets 31 disposed at both ends of the plurality of sockets 31 in the width direction Y. Further, a position of the slope surface opening 33a in the transfer direction X does not overlap the axis A1 of the socket 31. The position of the slope surface opening 33a is on the upstream side in the transfer direction X with respect to the axis A1 of the socket 31.

According to this configuration, the nitrogen gas introduced from the socket 31 first collides with the upper rectifying slope surface 32a. Next, the nitrogen gas moves downward along the upper rectifying slope surface 32a. Then, the nitrogen gas flows into a fourth flow path part 40a from the slope surface opening 33a. The fourth flow path part 40a is a region surrounded by an inner purge side surface 21e of the purge housing 21 and an outer purge side surface 21f of the purge housing 21. Also, a surface that surrounds the fourth flow path part 40a may include the radiation side surface 11d of the radiation housing 11. No wall is provided on a lower surface side of the purge housing 21. The lower surface of the purge housing 21 includes an opening. This opening is the sub ejection port 40h.

<Operations and Effects>

The active energy radiation unit 1 and the active energy radiation device 100 have the main gas supply mechanism 30 disposed on the upstream side of the light source 12 in the transfer direction X of the target object 300. When the nitrogen gas is ejected from the main gas supply mechanism 30, the nitrogen gas flows downstream. As a result, the purge region S20 having a low oxygen concentration is formed around the active energy radiation region S10. The main gas supply mechanism 30 receives the nitrogen gas from the receiving part 30d and ejects the nitrogen gas from the main ejection port 30h. Here, the flow path area from the receiving part 30d to the main ejection port 30h is constant. In a case in which the flow path area is constant, a state of the nitrogen gas is maintained between the receiving part 30d and the main ejection port 30h. Then, the flow of the nitrogen gas ejected from the main ejection port 30h includes the first flow F1 directed toward the downstream side, that is, toward the active energy radiation region S10, and the second flow F2 directed vertically downward toward the target object 300. The first flow F1 forms the purge region S20 having a low oxygen concentration around the active energy radiation region S10. Movements of the first flow F1 and the target object 300 induce an airflow from the upstream side of the active energy radiation unit 1 toward the active energy radiation region S10. That is, the air containing oxygen is supplied toward the active energy radiation region S10. On the other hand, the second flow F2 flows vertically downward toward the target object 300. This vertically downward second flow F2 can block the airflow. Therefore, the active energy radiation unit 1 and the active energy radiation device 100 can form the purge region S20 around the active energy radiation region S10 by supplying the nitrogen gas to the active energy radiation region S10. Further, the active energy radiation unit 1 and the active energy radiation device 100 can block the air supplied from surroundings to the active energy radiation region S10. As a result, the region in which the oxygen concentration is kept low is enlarged in the vicinity of the active energy radiation region S10. Therefore, the region in which a desired optical processing result is obtained can be enlarged.

The length of the main ejection port 30h in the width direction Y is longer than the length of the light source 12 in the width direction Y. According to this configuration, the purge region S20 including the active energy radiation region S10 can be reliably formed. The air supplied to the active energy radiation region S10 from the upstream side can be reliably blocked.

Figure 6:
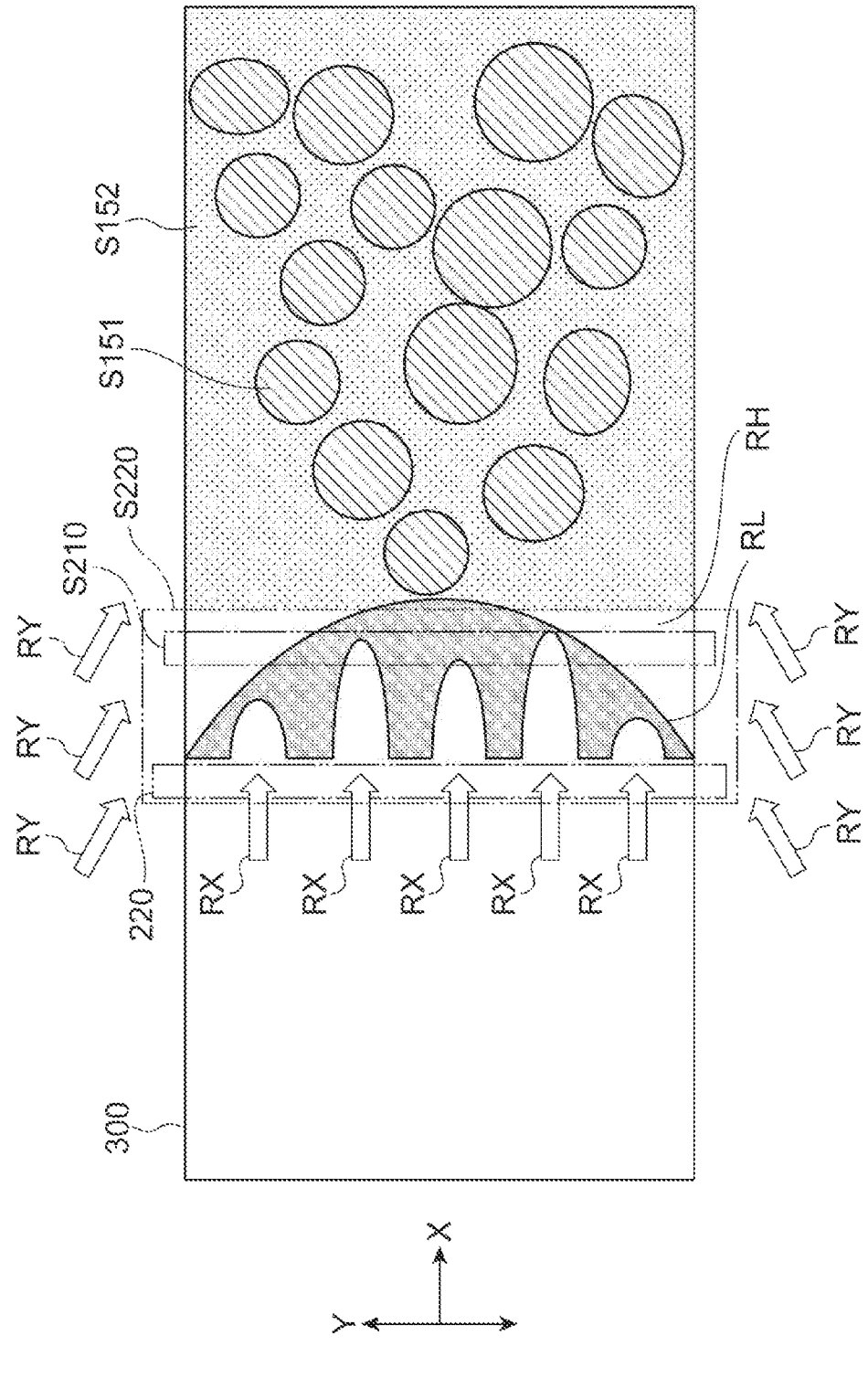
FIG. 6 is a diagram for explaining an effect of an active energy radiation unit of a comparative example.
Figure 7:
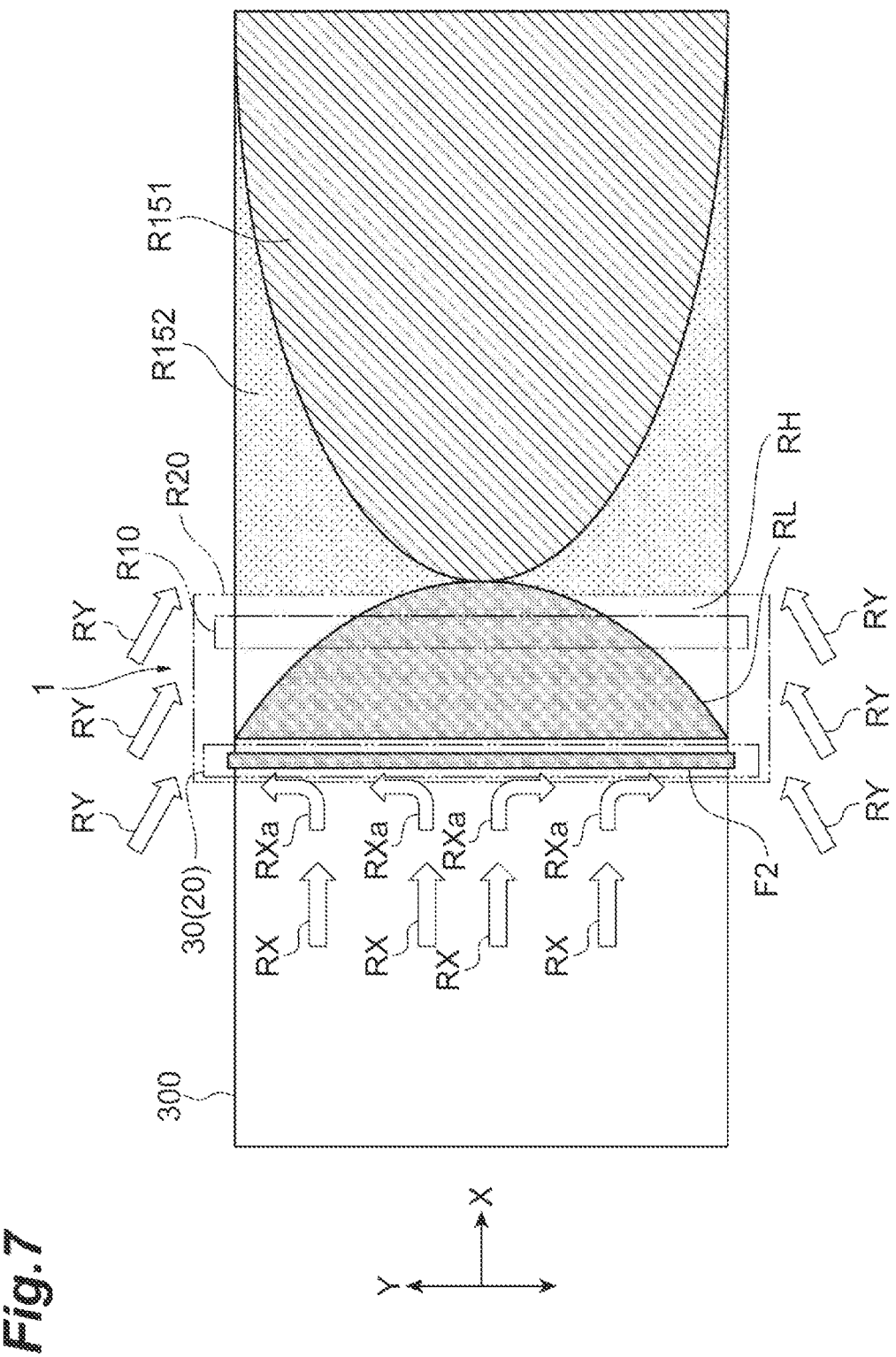
FIG. 7 is a diagram for explaining an effect of the main gas supply mechanism of the embodiment.

Operations and effects of the main gas supply mechanism 30 in the purge part 20 will be further described with reference to FIGS. 6 and 7. FIG. 6 is a diagram for explaining an operation of an active energy radiation unit of a comparative example. The active energy radiation unit of the comparative example includes a purge part 220. The purge part 220 generates only the first flow F1 of nitrogen gas. That is, the purge part 220 does not generate the second flow F2. Similarly, the purge part 220 does not include a configuration corresponding to the sub gas supply mechanism 40. FIG. 7 is a diagram for explaining an operation of the main gas supply mechanism 30 included in the active energy radiation unit 1. In order to focus on an operation of the main gas supply mechanism 30, the sub gas supply mechanism 40 is not shown.

As shown in FIG. 6, the active energy radiation unit ejects the nitrogen gas from the purge part 220. The nitrogen gas forms a purge region S220 including a light radiation region S210. However, the purge region S220 is supplied with air (arrow RX) from the upstream side as the target object 300 moves. Further, air RY is also supplied from side portions of the active energy radiation unit. As a result, the purge region S220 includes a region RH having a high oxygen concentration (a region having a low nitrogen concentration) and a region RL having a low oxygen concentration (a region having a high nitrogen concentration) due to the air supplied from the surroundings. That is, the oxygen concentration in the purge region S220 is non-uniform. When the oxygen concentration in the purge region S220 is non-uniform, a variation in a degree of drying of a resin film occurs on the downstream side of the light radiation region S210. Specifically, regions S151 in which the degree of drying is sufficient and regions S152 in which the degree of drying is insufficient are randomly distributed.

On the other hand, in the active energy radiation unit 1 shown in FIG. 7, in addition to the first flow F1 of the nitrogen gas from the purge part 20, the second flow F2 of the nitrogen gas is further generated. The second flow F2 hinders an air supply from the upstream side of the active energy radiation unit 1 (see arrow RXa in FIG. 7). As a result, the non-uniform oxygen concentration in the purge region S20 caused by the air supplied from the upstream side is eliminated. Therefore, the region RL in which the oxygen concentration is kept low and the variation in the oxygen concentration is reduced is enlarged. As a result, the region in which a desired optical processing result is obtained can be enlarged.

The active energy radiation unit 1 further includes the sub gas supply mechanism 40 that extends in the transfer direction X and is disposed to sandwich the active energy radiation region S10 to eject the nitrogen gas. One end of the sub gas supply mechanism 40 is connected to the main gas supply mechanism 30. The other end of the sub gas supply mechanism 40 is disposed on the downstream side of the light source 12 in the transfer direction X. The airflow toward the active energy radiation region S10 is provided from the upstream side of the active energy radiation region S10. Further, the airflow toward the active energy radiation region S10 is also provided from the side portion sides of the active energy radiation region S10. According to the sub gas supply mechanism 40, the airflow from the side portion sides of the active energy radiation region S10 toward the active energy radiation region S10 can be blocked. As a result, the light source 12 is disposed in the region surrounded by the main gas supply mechanism 30 and the sub gas supply mechanism 40. Therefore, the purge region S20 including the active energy radiation region S10 can be reliably formed. That is, the region in which a desired optical processing result is obtained can be further enlarged.

Figure 8:
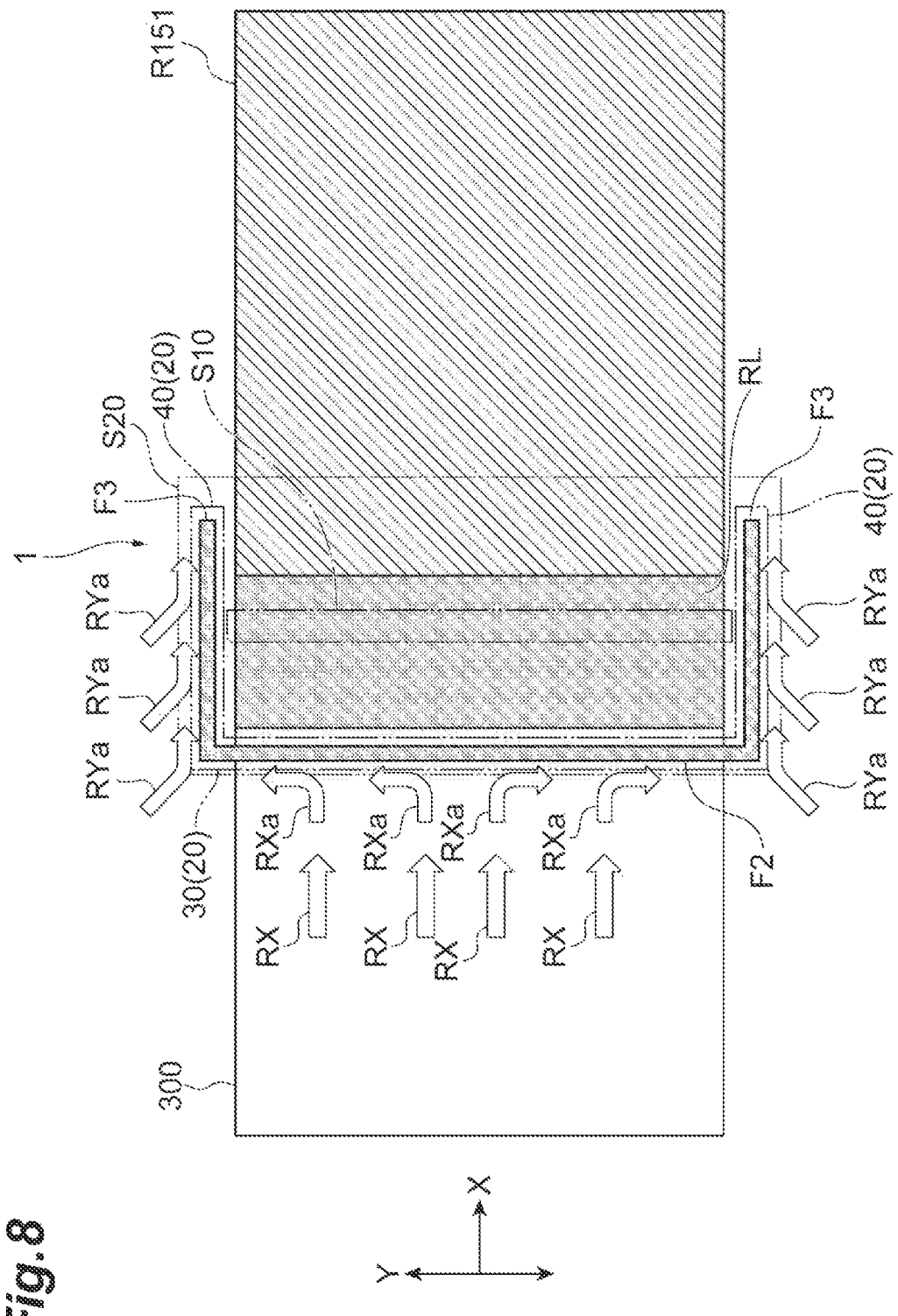
FIG. 8 is a diagram for explaining an effect of the sub gas supply mechanism of the embodiment.

As shown in FIG. 7, the region RL having a low oxygen concentration and a reduced variation in oxygen concentration is formed by the second flow F2 generated by the main gas supply mechanism 30. As shown in FIG. 8, the sub gas supply mechanism 40 inhibits the air supply from the side portion sides of the active energy radiation unit 1 using a third flow F3 (see arrow RYa in FIG. 8). As a result, according to the sub gas supply mechanism 40, the region RL having a low oxygen concentration and a reduced variation in oxygen concentration is further enlarged.

The main gas supply mechanism 30 further has the socket 31 to which a gas pipe for supplying the compressed nitrogen gas is connected, the first flow path part 30a which receives the nitrogen gas from the socket 31, and the second flow path part 30b which receives the nitrogen gas from the first flow path part 30a and provides the receiving part 30d with the nitrogen gas. The flow path area of the first flow path part 30a is larger than the flow path areas of the socket 31 and the second flow path part 30b. The first flow path part 30a is disposed to intersect the axis A1 of the socket 31 and includes the rectifying plate 32 which inhibits the flow of the nitrogen gas received from the socket 31. According to this configuration, the flow of the nitrogen gas received from the socket 31 spreads in the width direction Y due to two operations, the operation of the movement from the socket 31 to the first flow path part 30a resulting in the enlargement of the flow path area and the operation of the rectifying plate 32 inhibiting the flow of the nitrogen gas. As a result, a distribution in flow rate of the nitrogen gas ejected from the main ejection port 30h in the width direction Y becomes uniform. Therefore, the flow rate of the nitrogen gas required to form the purge region S20 can be reduced.

The rectifying plate 32 has the upper rectifying slope surface 32a as a surface for inhibiting the flow of the nitrogen gas. The rectifying plate 32 forms a flow path whose flow path area gradually decreases. According to this flow path, operating noises of the main gas supply mechanism 30 can be reduced.

The effects of the rectifying plate 32 were confirmed using numerical analysis. In analysis example 1, a flow generated by the purge part 220 not including the rectifying plate 32 as a comparative example was analyzed. In analysis example 2, a flow generated by the purge part 20 including the rectifying plate 32 was analyzed. Conditions for supplying the nitrogen gas from the socket 31 were set as analysis conditions. Then, under these conditions, states of gas flows generated by the purge parts 220 and 20 were obtained through analysis. Furthermore, the gas flows after ejection from the main ejection port 30h of the main gas supply mechanism 30 and the sub ejection port 40h of the sub gas supply mechanism 40 were obtained through analysis.

<Analysis Example 1: Without Rectifying Plate>

Figure 9:
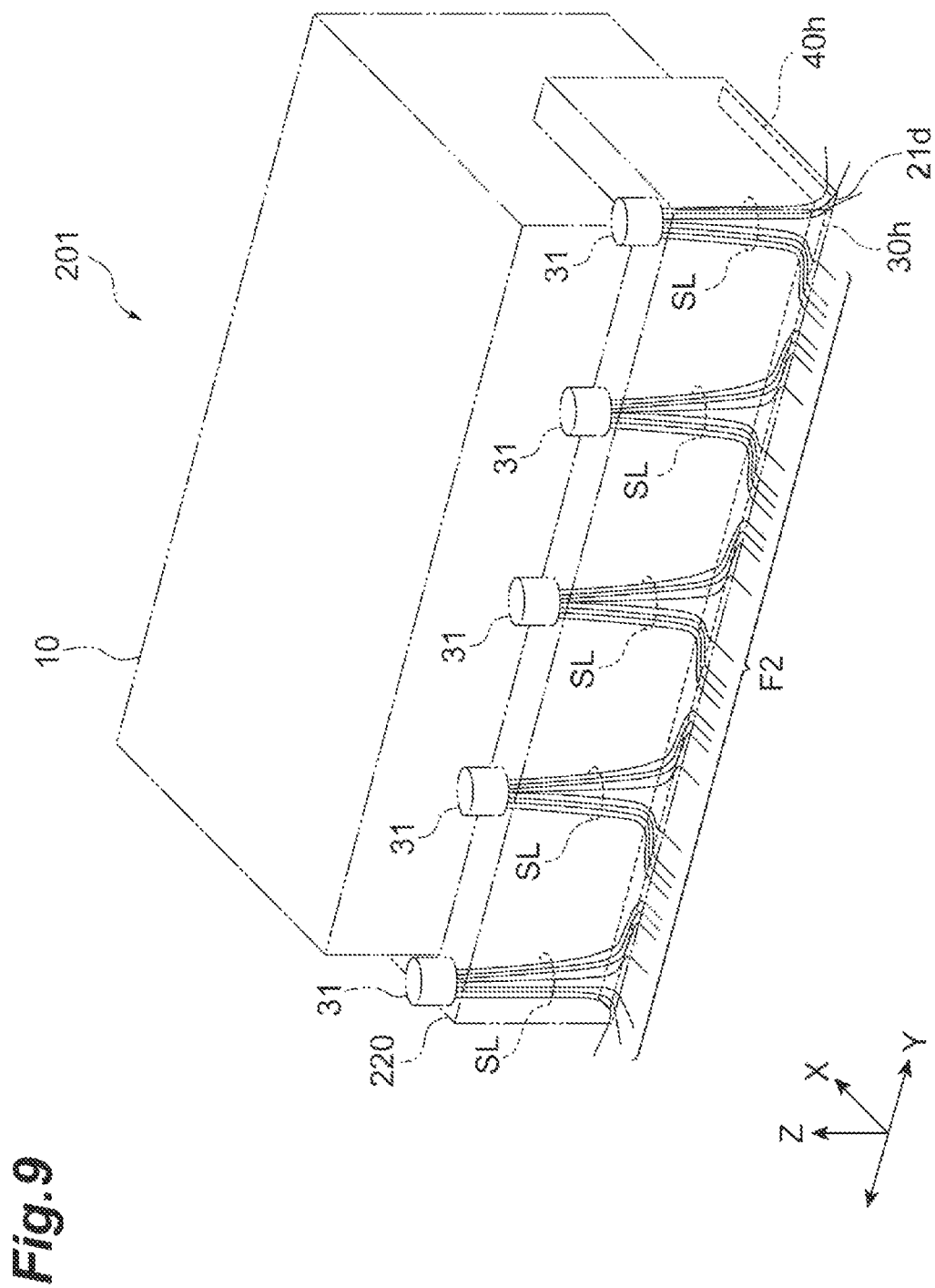
FIG. 9 is a perspective view showing a result of analyzing a gas flow generated by a purge mechanism of the comparative example.
Figure 10:
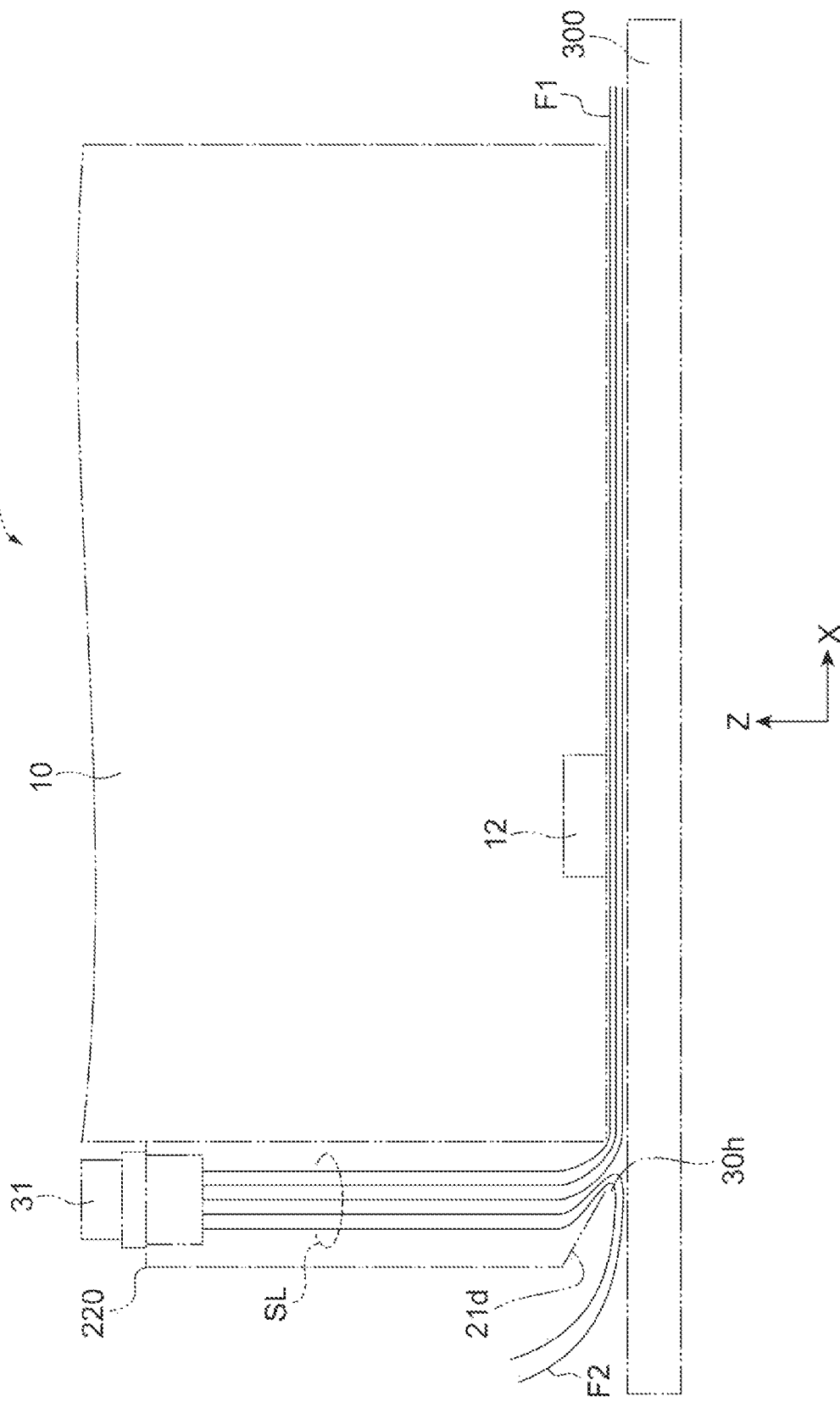
FIG. 10 is a side view showing a result of analyzing a gas flow generated by a purge part of the comparative example.
Figure 11:
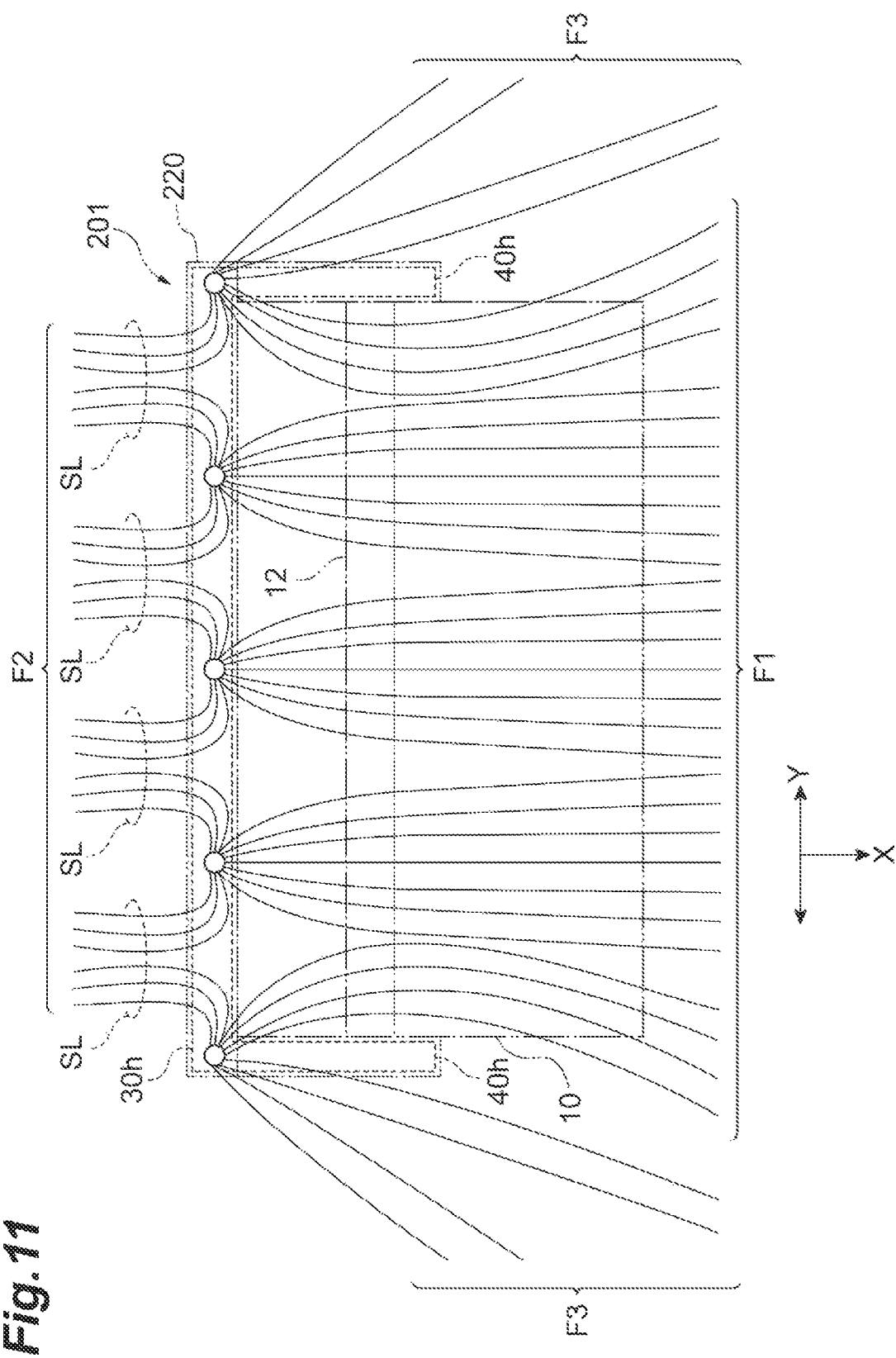
FIG. 11 is a bottom view showing a result of analyzing the gas flow generated by the purge part of the comparative example.

FIGS. 9, 10 and 11 are diagrams showing results of the analysis example 1. In each figure, a flow state is indicated by a plurality of streamlines SL. In FIGS. 9, 10 and 11, the streamlines SL are shown as solid lines. With reference to FIGS. 9 and 10, it was found that a gas ejected from the socket 31 flows linearly until it reaches the purge slope surface 21d. Then, it was found that the gas reaching the purge slope surface 21d spreads in the width direction Y and then is ejected from the main ejection port 30h and the sub ejection port 40h. With reference to FIG. 11, it was found that there was a variation in density of the streamlines SL in the width direction Y. Presence of the variation in density of the streamlines SL suggests that there is a variation in gas flow rate in the width direction Y. That is, it was found that a variation in a flow rate distribution of the ejected gas in the width direction Y occurs in a case in which the rectifying plate 32 is not provided. In a case in which such a variation exists, the gas is supplied from the socket 31 such that the minimum flow rate in the variation satisfies a minimum flow rate for forming the purge region S20. That is, it was found that there is a possibility that a large amount of gas may need to be supplied in order to form the purge region S20 in the case in which the rectifying plate 32 is not provided.

<Analysis Example 2: With Rectifying Plate>

Figure 12:
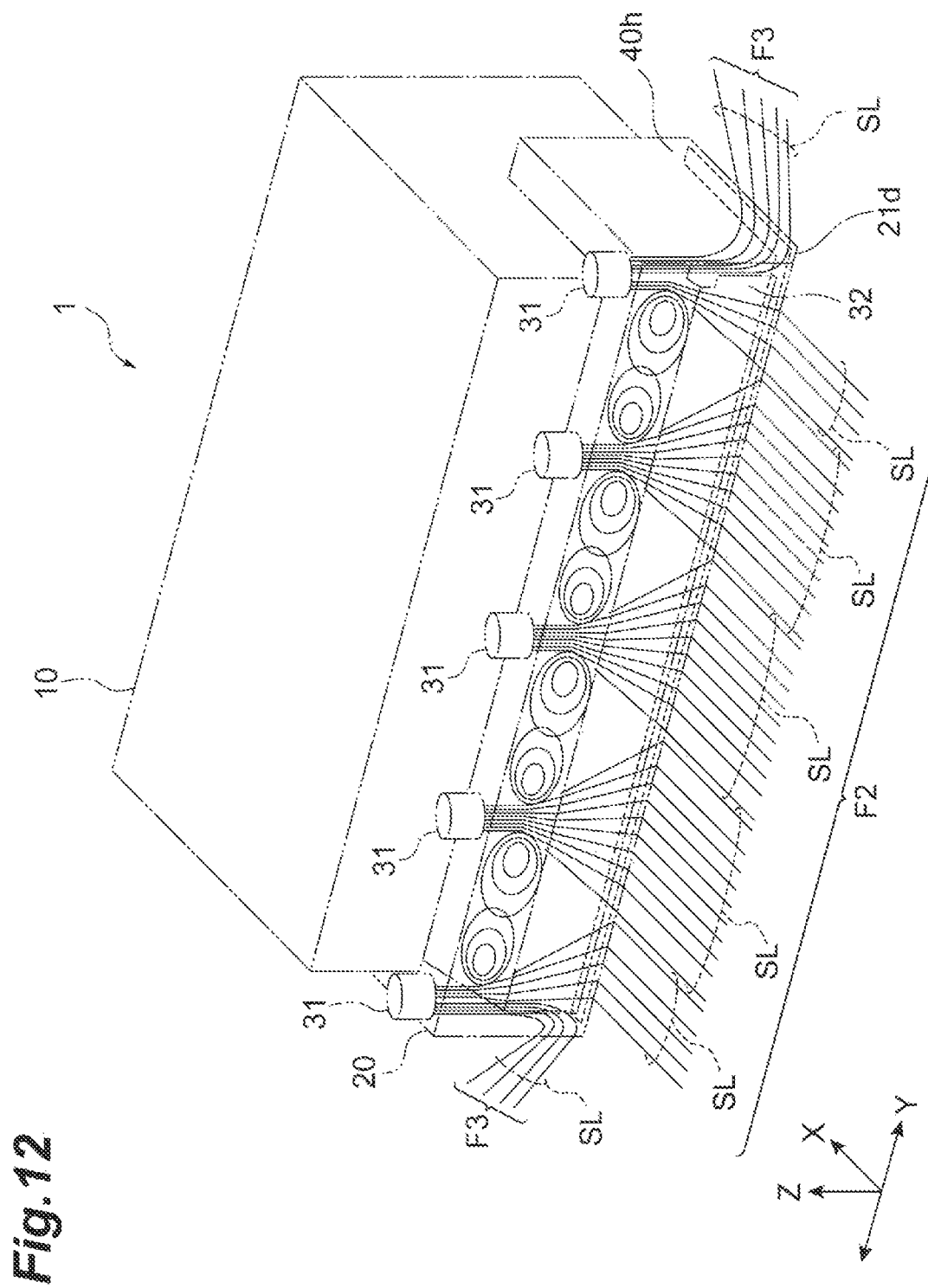
FIG. 12 is a perspective view showing a result of analyzing a gas flow generated by a purge part of the embodiment.
Figure 13:
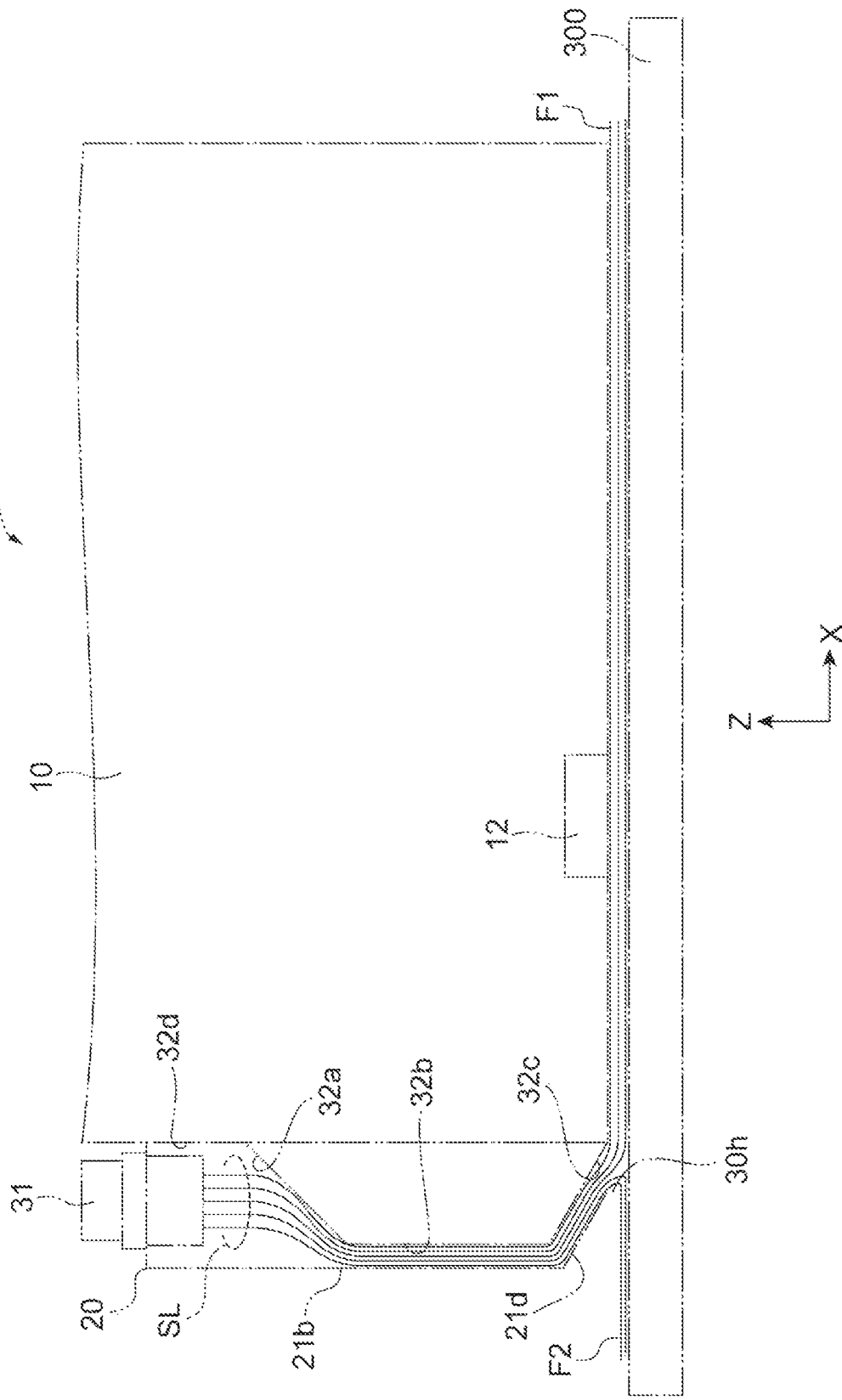
FIG. 13 is a side view showing a result of analyzing the gas flow generated by the purge part of the embodiment.
Figure 14:
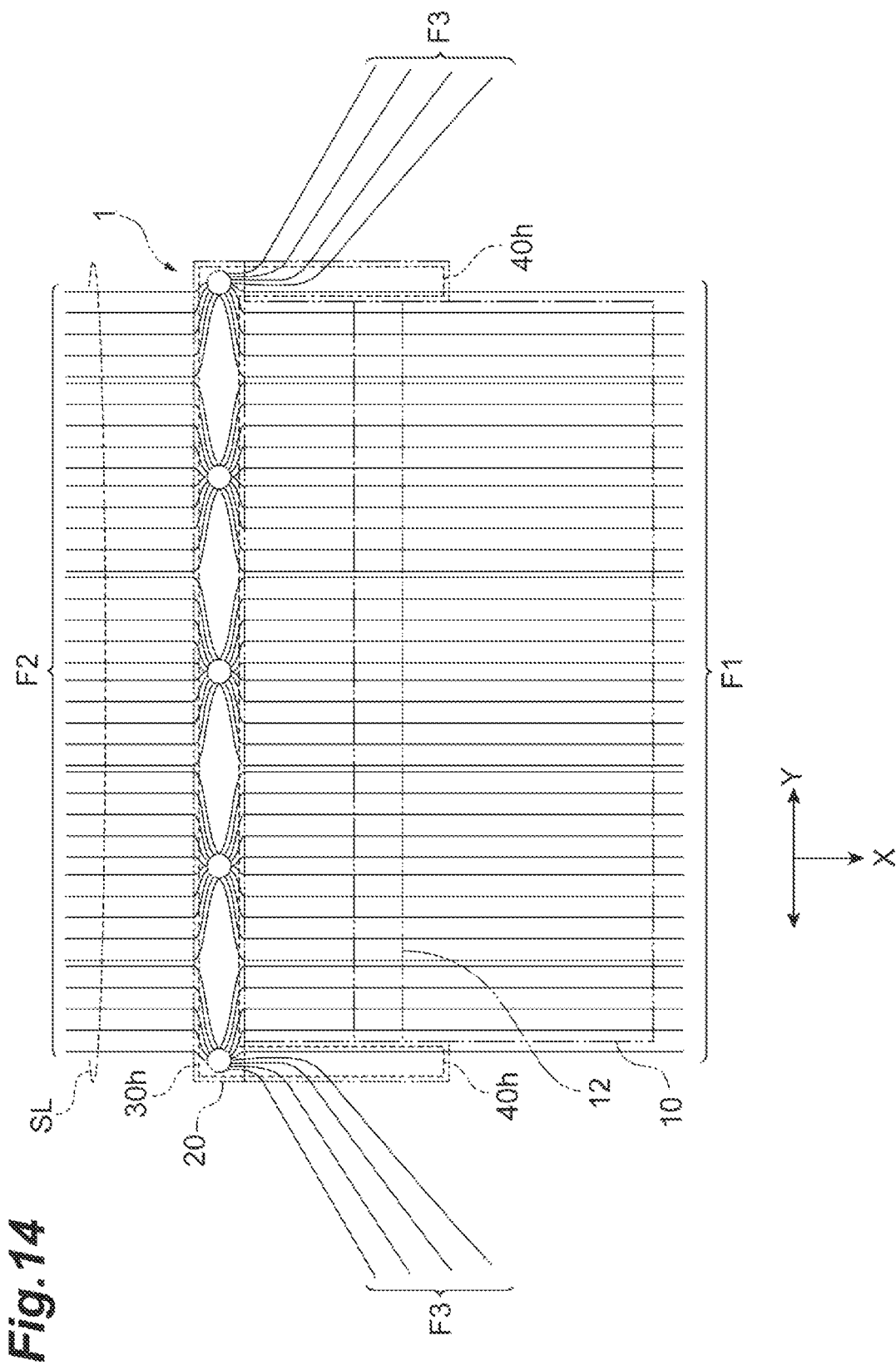
FIG. 14 is a bottom view showing a result of analyzing the gas flow generated by the purge part of the embodiment.

FIGS. 12, 13 and 14 are diagrams showing results of the analysis example 2. In each figure, a flow state is indicated by a plurality of streamlines SL. Referring to FIGS. 12 and 13, the gas ejected from the socket 31 flows linearly until it reaches the upper rectifying slope surface 32a. Then, the gas spreads in the width direction Y while flowing along the upper rectifying slope surface 32a. Then, the gas further spreads in the width direction Y in the second flow path part 30b. As a result, when the gas is ejected from the main ejection port 30h via the third flow path part 30c, the gas flow rate distribution in the width direction Y becomes substantially uniform. This situation can be better understood with reference to FIG. 14. According to FIG. 14, it was found that the flow of gas ejected from the main ejection port 30h was substantially uniform in the width direction Y in the first flow F1 which was directed to the downstream side. Similarly, it was found that the flow of gas ejected from the main ejection port 30h was substantially uniform in the width direction Y along the second flow F2 which was directed to the upstream side. That is, it was found that the variation in the flow rate of the gas ejected in the width direction Y is reduced in the case in which the rectifying plate 32 is provided. Therefore, it was found that the configuration including the rectifying plate 32 may reduce an amount of gas required to form the purge region S20 more than the configuration including no rectifying plate 32.

Also, the active energy radiation unit and the active energy radiation device according to the present disclosure are not limited to the above embodiment. The active energy radiation unit and the active energy radiation device may be implemented in various forms without being limited to the above embodiment.

Figure 15:
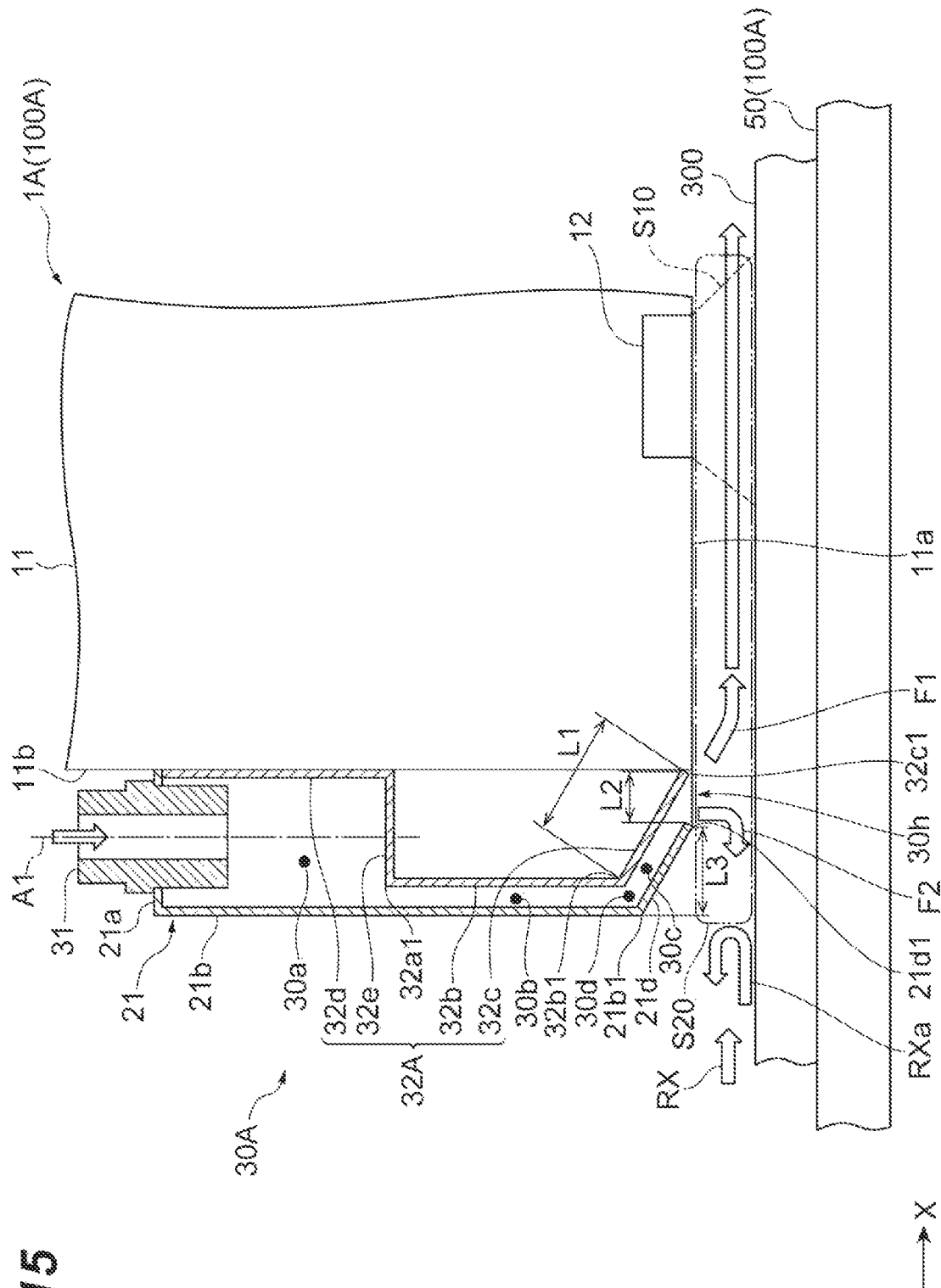
FIG. 15 is a cross-sectional view showing a main gas supply mechanism included in an active energy radiation unit of a modified example.

For example, as shown in FIG. 15, the active energy radiation unit 1A included in the active energy radiation device 100A has the main gas supply mechanism 30A. The main gas supply mechanism 30A has a rectifying plate 32A. This rectifying plate 32A has a rectifying plane 32e instead of the upper rectifying slope surface 32a described in the embodiment. That is, the surface with which the flow of the nitrogen gas received from the socket 31 collides does not have to be inclined with respect to the direction of the flow of the nitrogen gas. That is, the surface with which the flow of nitrogen gas collides may be orthogonal to the direction of the gas flow like the rectifying plane 32e. The rectifying plate 32A adopts a flow path configuration in which the flow path area is sharply reduced, such as an L shape. In the case of adopting the configuration in which the flow path area is sharply reduced, the region of the first flow path part 30a may be expanded as compared to the case of adopting the configuration in which the flow path area is gradually reduced (the case of the main gas supply mechanism 30 of the embodiment). Even with such a flow path configuration, the flow of the nitrogen gas received from the socket 31 can spread in the width direction Y due to the two operations, the operation of the movement from the socket 31 to the first flow path part 30a resulting in the enlargement of the flow path area and the operation of the rectifying plate 32A inhibiting the flow of the nitrogen gas. That is, by making the flow rate distribution of the nitrogen gas ejected from the main ejection port 30h in the width direction Y uniform, it is possible to reduce the flow rate of the nitrogen gas required to form the purge region S20.

In the above-described embodiment, the active energy radiation unit 1 exemplifies a configuration in which the target object 300 moved by the transfer device 50 is irradiated with the active energy rays. The target object 300 that receives the active energy rays from the active energy radiation unit 1 does not need to move. That is, the active energy radiation unit 1 may irradiate a stationary target object 300 with the active energy rays. In this case, both the active energy radiation unit 1 and the target object 300 may be stationary. Alternatively, only the target object 300 may be stationary, and the transfer device 50 may move the active energy radiation unit 1 with respect to the target object 300.

For the main gas supply mechanism 30, three modified examples which will be described below may be employed. In main gas supply mechanisms 30B, 30C, and 30D according to the modified examples, directions in which the nitrogen gas is ejected are different from each other. The main gas supply mechanisms according to the modified examples are selected in accordance with a transfer speed of the target object 300, as will be described later.

<Main Gas Supply Mechanism According to First Modified Example>

Figure 16:
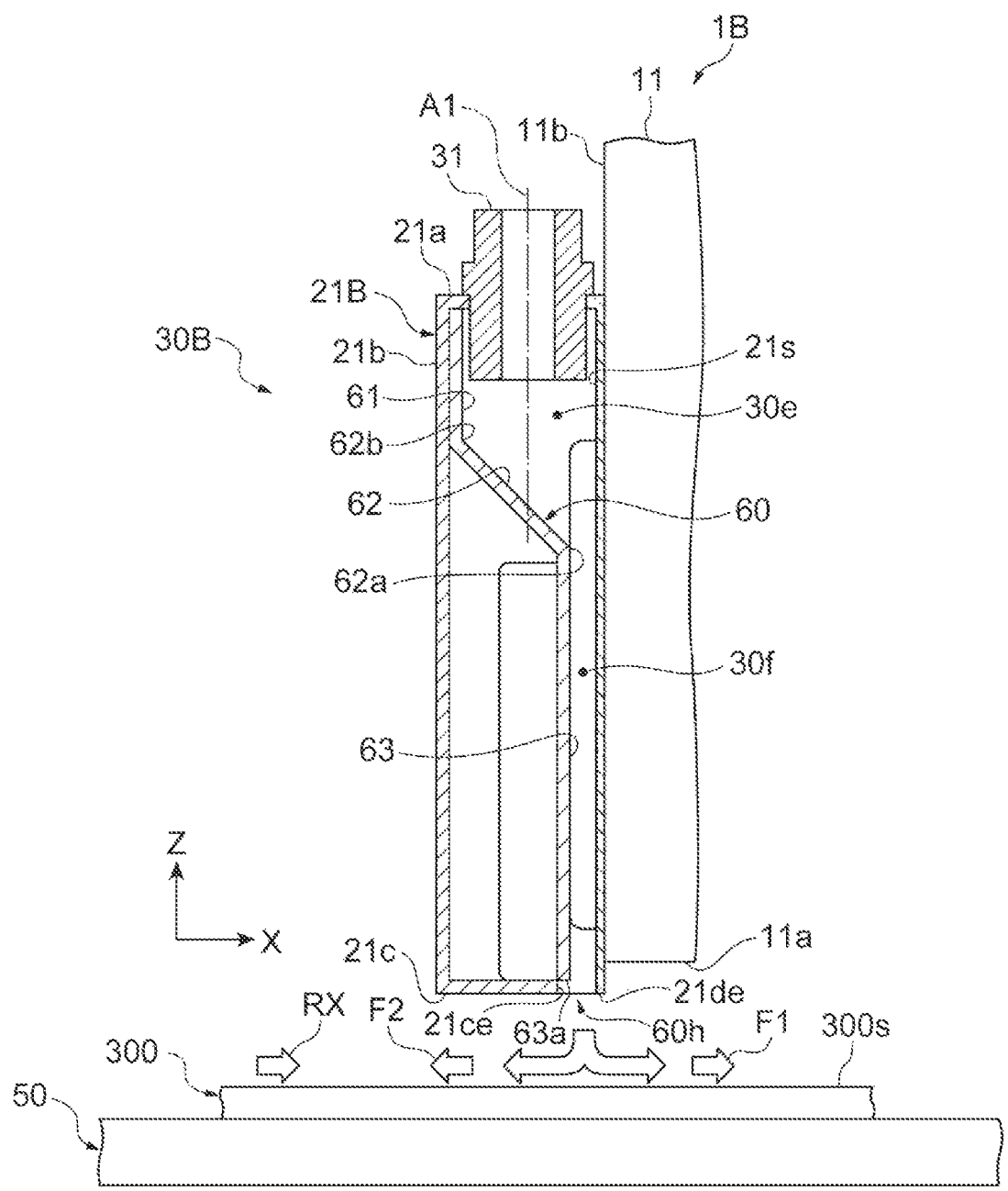
FIG. 16 is a cross-sectional view showing a first modified example of the main gas supply mechanism.

As shown in FIG. 16, an active energy radiation unit 1B of a first modified example has a main gas supply mechanism 30B. The main gas supply mechanism 30B ejects nitrogen gas vertically downward to a main surface 300s of the target object 300. That is, the main gas supply mechanism 30B of the first modified example is different from the main gas supply mechanism 30 of the embodiment in a direction in which the nitrogen gas is ejected. The main gas supply mechanism 30B has a purge housing 21B, sockets 31, and a rectifying plate 60.

The purge housing 21B has a purge upper surface 21a, a purge front surface 21b, a purge bottom surface 21c, and a purge back surface 21s. The sockets 31 are provided on the purge upper surface 21a. The rectifying plate 60 is fixed to the purge front surface 21b. The rectifying plate 60 has an upper rectifying upright surface 61, a rectifying slope surface 62, and a lower rectifying upright surface 63. The purge bottom surface 21c faces the main surface 300s of the target object 300 and forms a part of a main ejection port 60h. The purge back surface 21s comes into contact with the radiation front surface 11b of the radiation housing 11. The rectifying plate 60 forms a flow path through which the nitrogen gas passes in cooperation with the purge housing 21B.

The main gas supply mechanism 30B includes a fifth flow path part 30e and a sixth flow path part 30f. The nitrogen gas received from the socket 31 passes through the fifth flow path part 30e, then passes through the sixth flow path part 30f, and is finally ejected from the main ejection port 60h.

The fifth flow path part 30e receives the nitrogen gas from the socket 31 and provides the nitrogen gas to the sixth flow path part 30f. The fifth flow path part 30e is a region surrounded by the purge upper surface 21a, the upper rectifying upright surface 61, the rectifying slope surface 62, and the purge back surface 21s. The fifth flow path part 30e includes a portion whose flow path area decreases in a direction in which the nitrogen gas flows. Specifically, the fifth flow path part 30e includes a portion between the upper rectifying upright surface 61 and the purge back surface 21s, and a portion between the rectifying slope surface 62 and the purge back surface 21s. A distance from the upper rectifying upright surface 61 to the purge back surface 21s is constant. Therefore, the flow path area is constant. On the other hand, the rectifying slope surface 62 is inclined with respect to the height direction Z. In other words, a lower side 62a of the rectifying slope surface 62 is located downstream from an upper side 62b of the rectifying slope surface 62 in the transfer direction X. That is, an inclination of the rectifying slope surface 62 is opposite to that of the upper rectifying slope surface 32a of the embodiment. According to this configuration, the flow path area gradually decreases toward the sixth flow path part 30f.

The socket 31 is provided on the purge upper surface 21a such that the axis A1 is located at substantially a center between the purge front surface 21b and the purge back surface 21s. That is, the axis A1 of the socket 31 intersects the rectifying slope surface 62. In other words, the axis A1 of the socket 31 is disposed between the lower side 62a and the upper side 62b of the rectifying slope surface 62 in the transfer direction X. According to this configuration, the flow of the nitrogen gas received from the socket 31 collides with the rectifying slope surface 62. Then, the nitrogen gas flows downstream in the transfer direction X along the rectifying slope surface 62 and reaches the sixth flow path part 30f.

The sixth flow path part 30f receives the nitrogen gas from the fifth flow path part 30e and provides the nitrogen gas to the main ejection port 60h. In other words, the sixth flow path part 30f guides the nitrogen gas toward the target object 300 side in the height direction Z. The sixth flow path part 30*f* is a region surrounded by the lower rectifying upright surface 63 and the purge back surface 21*s*. In addition, a space between an upper side of the lower rectifying upright surface 63 (that is, the lower side 62*a* of the rectifying slope surface 62) and the purge back surface 21*s* corresponds to a receiving part which receives the nitrogen gas that is the compressed inert gas. A distance from the lower rectifying upright surface 63 to the purge back surface 21*s* is constant. That is, a flow path area of the sixth flow path part 30*f* is constant. The flow path area of the sixth flow path part 30*f* is smaller than the flow path area between the upper rectifying upright surface 61 and the purge back surface 21*s* in the fifth flow path part 30*e*. The flow path area of the sixth flow path part 30*f* is the same as the flow path area between the lower side 62*a* of the rectifying slope surface 62 and the purge back surface 21*s* in the fifth flow path part 30*e*.

An end of the sixth flow path part 30*f* includes the main ejection port 60*h*. The main ejection port 60*h* is closer to the target object 300 than the radiation main surface 11*a* that is the bottom surface of the radiation housing 11. In other words, a distance from the main ejection port 60*h* to the main surface 300*s* of the target object 300 is smaller than a distance from the radiation main surface 11*a* to the main surface 300*s* of the target object 300. That is, in the first modified example, a bottom surface of the main gas supply mechanism 30B is not flush with the bottom surface of the radiation housing 11, but protrudes from the bottom surface of the radiation housing 11.

The main ejection port 60*h* is formed between a lower end 63*a* of the lower rectifying upright surface 63 and a lower end 21*de* of the purge back surface 21*s*. Also, a rear end 21*ce* of a bottom surface of the purge bottom surface 21*c* on the downstream side may be included among components that constitute the main ejection port 60*h*. The lower rectifying upright surface 63 is perpendicular to the purge bottom surface 21*c*. Further, the purge back surface 21*s* is also perpendicular to the purge bottom surface 21*c*. If the purge bottom surface 21*c* is disposed parallel to the main surface 300*s* of the target object 300, the lower rectifying upright surface 63 and the purge back surface 21*s* are perpendicular to the main surface 300*s* of the target object 300. Then, a flow direction of the nitrogen gas flowing through the sixth flow path part 30*f* is perpendicular to the main surface 300*s* of the target object 300, and the nitrogen gas is ejected toward the target object 300 from the main ejection port 60*h* while the above direction is maintained.

The nitrogen gas blown perpendicularly to the main surface 300*s* of the target object 300 changes its flow direction after colliding with the main surface 300*s*. Some nitrogen gas flows downstream. In other words, a part of the nitrogen gas flows in the same direction as the transfer direction X of the target object 300. This part of the nitrogen gas reaches the active energy radiation region S10 and forms the purge region S20. That is, the flow of the part of the nitrogen gas corresponds to the first flow F1 in the embodiment.

Another part of the nitrogen gas flows upstream. In other words, another part of the nitrogen gas flows in a direction opposite to the transfer direction X of the target object 300. This other part of the nitrogen gas hinders the air (arrow RX) flowing in from between a lower end of the purge front surface 21*b* and the main surface 300*s* of the target object 300. That is, the flow of the other part of the nitrogen gas corresponds to the second flow F2 in the embodiment.

The main gas supply mechanism 30B according to the first modified example can make a balance between a flow rate of the nitrogen gas flowing downstream and a flow rate of the nitrogen gas flowing upstream different from a balance of flow rates in the main gas supply mechanism 30 of the embodiment. Specifically, the flow rate of the nitrogen gas flowing upstream can be increased. Then, an ability to hinder the air flowing in from between the lower end of the purge front surface 21*b* and the main surface 300*s* of the target object 300 is enhanced. As a result, it is possible to cope with high-speed transfer of the target object 300 with which more air tries to flow in.

<Main Gas Supply Mechanism According to Second Modified Example>

Figure 17:
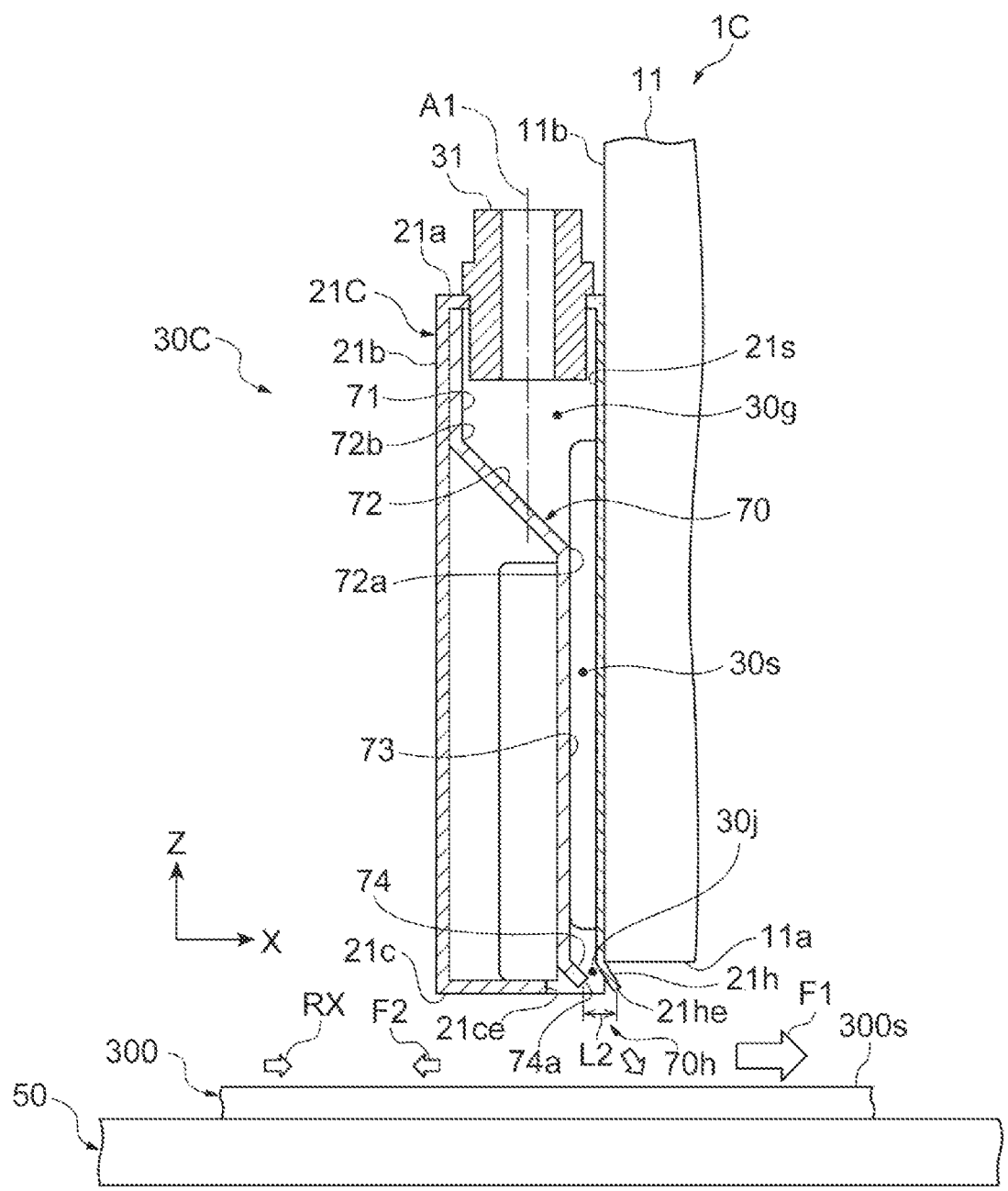
FIG. 17 is a cross-sectional view showing a second modified example of the main gas supply mechanism.

As shown in FIG. 17, an active energy radiation unit 1C of the second modified example has a main gas supply mechanism 30C. The main gas supply mechanism 30C ejects the nitrogen gas obliquely with respect to the main surface 300*s* of the target object 300. More specifically, the main gas supply mechanism 30C ejects the nitrogen gas toward the downstream side. In this respect, the main gas supply mechanism 30C according to the second modified example is the same as the main gas supply mechanism 30 of the embodiment. The flow generated by the main gas supply mechanism 30C according to the second modified example includes a first flow F1 and a second flow F2. Comparing the first flow F1 with the second flow F2, the first flow F1 is larger than the second flow F2. Most of the gas ejected from the main gas supply mechanism 30C becomes the first flow F1 and flows to the downstream side, but some gas also becomes the second flow F2 and flows to the upstream side. That is, the flow generated by the main gas supply mechanism 30C is dominated by the first flow F1. In other words, the main gas supply mechanism 30C of the second modified example causes most of the ejected nitrogen gas to flow downstream.

The main gas supply mechanism 30C also causes some of the ejected nitrogen gas to flow to the upstream side, although it is slight. This second flow F2 may or may not hinder the air that tries to flow in. For example, a case in which some nitrogen gas ejected from a main ejection port 70*h* tries to flow toward the upstream side but is pushed back by an inflow of air may be included.

The main gas supply mechanism 30C includes a purge housing 21C, sockets 31, and a rectifying plate 70. The rectifying plate 70 has an upper rectifying upright surface 71, an upper rectifying slope surface 72, a lower rectifying upright surface 73, and a lower rectifying slope surface 74. In addition, the main gas supply mechanism 30C includes a seventh flow path part 30*g*, an eighth flow path part 30*s*, and a ninth flow path part 30*j*. The nitrogen gas received from the socket 31 passes through the seventh flow path part 30*g*, the eighth flow path part 30*s*, and the ninth flow path part 30*j* in order and is finally ejected from the main ejection port 70*h*. Here, the seventh flow path part 30*g* has the same structure as the fifth flow path part 30*e*. Therefore, a detailed description of the seventh flow path part 30*g* will be omitted.

The eighth flow path part 30*s* is formed between the lower rectifying upright surface 73 and the purge back surface 21*s*, similarly to the sixth flow path part 30*f*. On the other hand, the eighth flow path part 30*s* does not include the main ejection port 70*h* unlike the sixth flow path part 30*f*. The eighth flow path part 30*s* is connected to the ninth flow path part 30*j*. That is, a length of the eighth flow path part 30*s* is shorter than a length of the sixth flow path part 30*f*.

The ninth flow path part 30*j* is formed between a purge slope surface 21*h* and the lower rectifying slope surface 74. An upper side of the purge slope surface 21*h* is continuous with a lower side of the purge back surface 21*s*. For example, a position of the lower side of the purge back surface 21s may coincide with a position of the lower side of the radiation front surface 11b. Then, the purge slope surface 21h extends obliquely from the lower side of the purge back surface 21s toward the downstream side. Therefore, the purge slope surface 21h is located below the radiation main surface 11a. The lower rectifying slope surface 74 extends obliquely from a lower side of the lower rectifying upright surface 73 toward the downstream side. The purge slope surface 21h and the lower rectifying slope surface 74 may be parallel to each other and a flow path area therebetween may be constant. A lower end 21he of the purge slope surface 21h and a lower side 74a of the lower rectifying slope surface 74 form the main ejection port 70h. This aspect that is different from the main gas supply mechanism 30 of the embodiment is realized by an opening length L2 of the main ejection port 70h. Specifically, the opening length L2 in the main gas supply mechanism 30C according to the second modified example is shorter than the opening length L2 in the main gas supply mechanism 30 of the embodiment. According to such a configuration, the nitrogen gas can be provided mainly as the first flow F1 to the downstream side.

On the other hand, when the target object 300 moves, the air present in the vicinity of the surface of the target object 300 is dragged with the movement of the target object 300 due to its viscosity. When the transfer speed of the target object 300 is low, a speed of the air dragged by the target object 300 is also low. In other words, an amount of air (see arrow RX) that tries to enter a gap between the active energy radiation unit 1C and the target object 300 as the target object 300 moves decreases. Then, it is not necessary to positively generate the flow of the nitrogen gas (second flow F2) that hinders the airflow (arrow RX). In other words, this is because, even if air has flown in from between the active energy radiation unit 1C and the target object 300, a flow rate thereof is slight, and thus a proportion of the air (oxygen) in the active energy radiation region S10 can be sufficiently reduced by supplying the nitrogen gas.

Since the nitrogen gas flowing from the main ejection port 70h toward the upstream side is less likely to reach the active energy radiation region S10, a degree of contribution thereof to the purge region S20 decreases. Therefore, in a case in which an inflow of air from the upstream side is small, a configuration of actively causing the nitrogen gas to flow downstream is adopted. As a result, an amount of the nitrogen gas required to form the purge region S20 can be reduced. Therefore, the main gas supply mechanism 30C configured to actively cause the nitrogen gas to flow downstream may be adopted when the transfer speed of the target object 300 is relatively low.

<Main Gas Supply Mechanism According to Third Modified Example>

Figure 18:
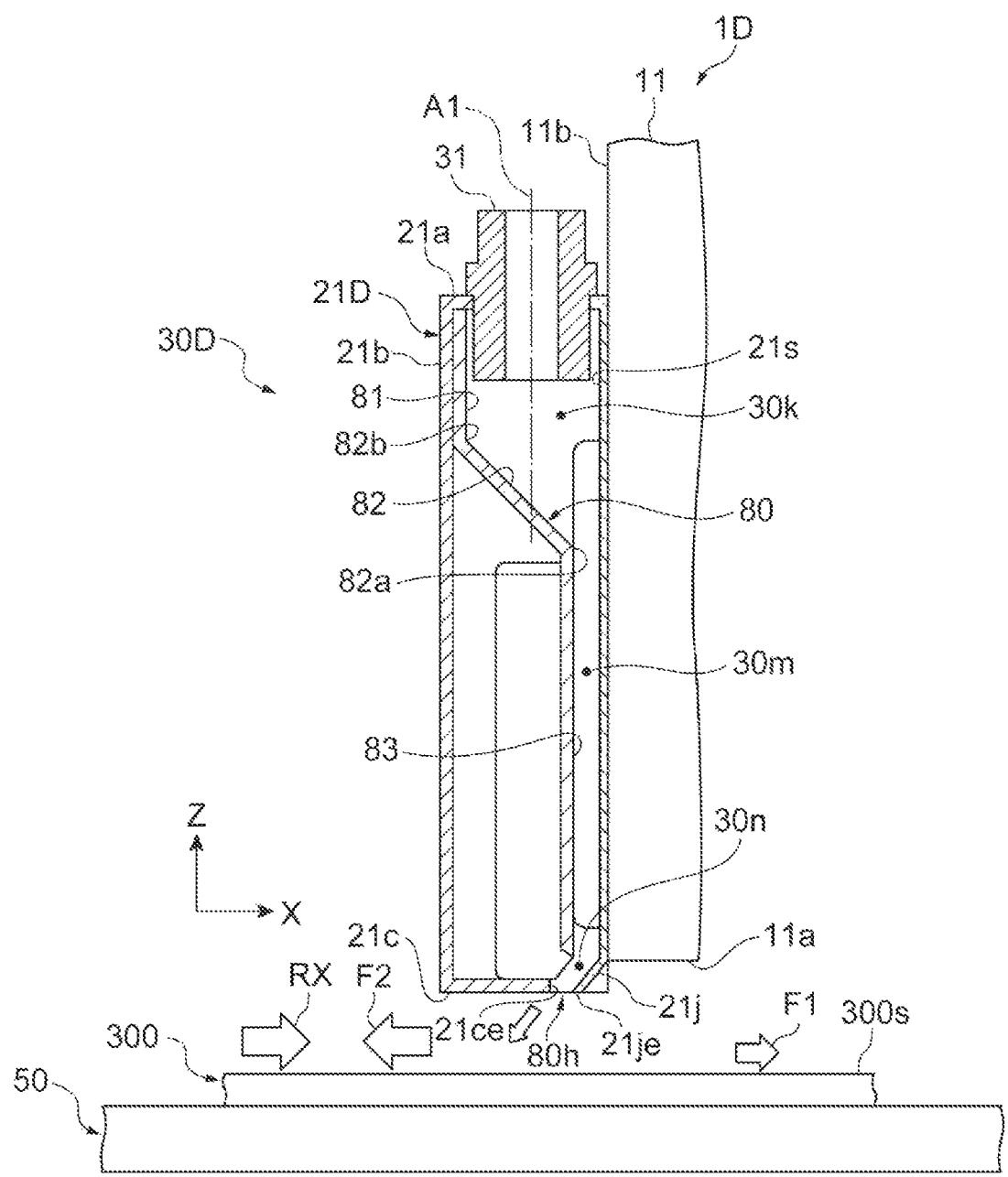
FIG. 18 is a cross-sectional view showing a third modified example of the main gas supply mechanism.

On the other hand, as shown in FIG. 18, in a case in which the transfer speed of the target object 300 is high, a large amount of the air (see arrow RX) tries to flow in between the active energy radiation unit 1D and the target object 300. Therefore, in the case in which the transfer speed of the target object 300 is high, it is highly necessary to hinder the air flowing in between the active energy radiation unit 1D and the target object 300. Therefore, the main gas supply mechanism 30D of a third modified example actively ejects the nitrogen gas toward the upstream side. That is, the main gas supply mechanism 30D of the third modified example performs ejection of the nitrogen gas with an emphasis on a function as an air curtain.

The active energy radiation unit 1D of the third modified example has a main gas supply mechanism 30D. The main gas supply mechanism 30D ejects the nitrogen gas obliquely with respect to the main surface 300s of the target object 300. More specifically, the main gas supply mechanism 30D ejects the nitrogen gas toward the upstream side. In this respect, the main gas supply mechanism 30D according to the third modified example is different from the main gas supply mechanism 30 of the embodiment.

The main gas supply mechanism 30D has a purge housing 21D, sockets 31, and a rectifying plate 80. In addition, the main gas supply mechanism 30D includes a tenth flow path part 30k, an eleventh flow path part 30m, and a twelfth flow path part 30n. The nitrogen gas received from the socket 31 passes through the tenth flow path part 30k, the eleventh flow path part 30m, and the twelfth flow path part 30n in order and is finally ejected from a main ejection port 80h. Here, the tenth flow path part 30k has the same structure as the fifth flow path part 30e. Further, the eleventh flow path part 30m has the same configuration as the eighth flow path part 30s. Therefore, detailed descriptions of the tenth flow path part 30k and the eleventh flow path part 30m will be omitted.

The eleventh flow path part 30m is formed by a purge slope surface 21j. An upper side of the purge slope surface 21j is continuous with a lower side of the purge back surface 21s. The purge slope surface 21j extends obliquely from the lower side of the purge back face 21s toward the upstream side. Therefore, the purge slope surface 21j is located below the radiation main surface 11a. A lower end 21je of the purge slope surface 21j and a rear end 21ce of a bottom surface of the purge bottom surface 21c form the main ejection port 80h in cooperation with each other. According to this configuration, the nitrogen gas flowing through the tenth flow path part 30k collides with the purge slope surface 21j. Then, it is guided to the upstream side along the purge slope surface 21j and ejected from the main ejection port 80h.

According to this configuration, most of the nitrogen gas becomes the second flow F2 and is provided upstream. As a result, since it is possible to sufficiently counter a large amount of air that tries to flow in, the inflow of air can be inhibited. Therefore, the main gas supply mechanism 30D configured to actively cause the nitrogen gas to flow upstream may be adopted when the transfer speed of the target object 300 is relatively high. In addition, some nitrogen gas may flow toward the upstream side and then be pushed back by the air and flow toward the downstream side. Further, when the nitrogen gas is ejected from the main ejection port 80h and collides with the target object 300, most of the nitrogen gas flows to the upstream side, but some nitrogen gas may flow to the downstream side and become the first flow F1. The nitrogen gas flowing toward the downstream side forms the purge region S20 including the active energy radiation region S10.

What is claimed is:
1. An active energy radiation unit comprising:
an active energy radiation part which radiates active energy rays onto a target object that passes along a transfer direction intersecting a width direction of the target object in in an active energy radiation region extending in the width direction; and
a main gas supply mechanism which is disposed upstream of the active energy radiation part in the transfer direction, and ejects an inert gas for forming an inactive region including the active energy radiation region between the target object and the active energy radiation part, wherein the main gas supply mechanism includes:
- a socket which receives the inert gas that has been compressed;
- a first flow path part which receives the inert gas discharged from the socket;
- a second flow path part which receives the inert gas from the first flow path part and causes the inert gas to flow along a direction of an axis of the socket, the second flow path part having a flow path area that is smaller than a flow path area of the first flow path part; and
- an ejection port which ejects the inert gas toward the target object, wherein the first flow path part includes a rectifying surface intersecting with the axis of the socket, and the inert gas that flows through the first flow path part flows along the rectifying surface after colliding with the rectifying surface and is guided to the second flow path part.

2. The active energy radiation unit according to claim 1 further comprising a sub gas supply mechanism which extends in the transfer direction, is disposed to sandwich the active energy radiation region in the width direction, and ejects the inert gas.

3. The active energy radiation unit according to claim 2,
wherein one end of the sub gas supply mechanism in the transfer direction is connected to the main gas supply mechanism, and
the active energy radiation part is disposed between the one end of the sub gas supply mechanism and the other end of the sub gas supply mechanism in the transfer direction.

4. The active energy radiation unit according to claim 1, wherein the second flow path part is disposed upstream of the axis of the socket in the transfer direction.

5. The active energy radiation unit according to claim 4, wherein
the main gas supply mechanism further includes a third flow path part,
one end of the third flow path part is connected to the second flow path part,
another end of the third flow path part is the ejection port, and
a flow path area of the third flow path part is constant.

6. The active energy radiation unit according to claim 4, wherein the third flow path part extends diagonally downward toward a downstream side in the transfer direction.

7. The active energy radiation unit according to claim 4, wherein the rectifying surface is a slope surface inclined with respect to the axis of the socket, and extends diagonally downward toward an upstream side in the transfer direction.

8. The active energy radiation unit according to claim 4, wherein the rectifying surface is a surface orthogonal to the axis of the socket, and extends parallel to the transfer direction.

9. The active energy radiation unit according to claim 1, wherein the second flow path part is disposed downstream of the axis of the socket in the transfer direction.

10. The active energy radiation unit according to claim 9, wherein the rectifying surface is a slope surface inclined with respect to the axis of the socket, and extends diagonally downward toward a downstream side in the transfer direction.

11. The active energy radiation unit according to claim 9, wherein the rectifying surface is a slope surface extending parallel to the axis of the socket from one end of the second flow path part to another end of the second flow path part.

12. The active energy radiation unit according to claim 9, wherein the second flow path part includes a first portion connected to the first flow path part and extending parallel to the axis of the socket, and a second portion connected to the first portion, extending diagonally downward toward the downstream side in the transfer direction, and including the ejection port.

13. The active energy radiation unit according to claim 9, wherein the second flow path part includes a first portion connected to the first flow path part and extending parallel to the axis of the socket, and a second portion connected to the first portion, extending diagonally downward toward the upstream side in the transfer direction, and including the ejection port.

14. An active energy radiation device comprising:
the active energy radiation unit according to claim 1; and
a transfer part which causes a relative movement of the target object with respect to the active energy radiation region.

* * * * *